United States Patent
Jin et al.

(10) Patent No.: US 12,200,639 B2
(45) Date of Patent: Jan. 14, 2025

(54) ELECTRONIC DEVICE FOR TRANSMITTING RADIO-FREQUENCY SIGNAL AND METHOD FOR OPERATING SAME

(71) Applicant: SAMSUNG ELECTRONICS CO., LTD., Suwon-si (KR)

(72) Inventors: Suho Jin, Suwon-si (KR); Dongju Lee, Suwon-si (KR); Hyeok Kwon, Suwon-si (KR); Jaeho Kim, Suwon-si (KR); Jongyeon Kim, Suwon-si (KR); Cheolwoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 347 days.

(21) Appl. No.: 17/880,527

(22) Filed: Aug. 3, 2022

(65) Prior Publication Data

US 2023/0040041 A1 Feb. 9, 2023

Related U.S. Application Data

(63) Continuation of application No. PCT/KR2022/010748, filed on Jul. 22, 2022.

(30) Foreign Application Priority Data

Aug. 4, 2021 (KR) .................. 10-2021-0102704

(51) Int. Cl.
*H04W 52/52* (2009.01)
*H04W 52/36* (2009.01)

(52) U.S. Cl.
CPC ......... *H04W 52/52* (2013.01); *H04W 52/367* (2013.01)

(58) Field of Classification Search
CPC .................. H04W 52/52; H04W 52/367
See application file for complete search history.

(56) References Cited

U.S. PATENT DOCUMENTS

| 5,052,020 A | * 9/1991 | Koenck | ............... B60R 11/0241 |
| | | | 375/317 |
| 9,041,464 B2 | 5/2015 | Komninakis | |
| (Continued) | | | |

FOREIGN PATENT DOCUMENTS

| CN | 112134577 | 12/2020 |
| EP | 2920877 | 1/2018 |
| (Continued) | | |

OTHER PUBLICATIONS

Search Report and Written Opinion dated Oct. 19, 2022 issued in International Patent Application No. PCT/KR2022/010748.

*Primary Examiner* — Junpeng Chen
(74) *Attorney, Agent, or Firm* — Nixon & Vanderhye, P.C.

(57) ABSTRACT

An electronic device may include: at least one communication processor, an RFIC, at least one power amplifier, and at least one converter and wherein the at least one communication processor is configured to: set a driving voltage, to be applied to a first power amplifier for amplifying a first RF signal provided from the RFIC among the at least one power amplifier, to be a first voltage, based on an APT mode, control at least part of the at least one converter to provide a first voltage, set based on the APT mode, to the first power amplifier during a transmission period of the first RF signal, and control at least part of the at least one converter to provide the first voltage to the first power amplifier during at least partial period of a remaining period in which no RF signal is transmitted, based on the occurrence of an event associated with audible noise.

20 Claims, 20 Drawing Sheets

(56) References Cited

U.S. PATENT DOCUMENTS

| | | |
|---|---|---|
| 10,278,143 B2 | 4/2019 | Kam |
| 2016/0241196 A1 | 8/2016 | Lehtola |
| 2016/0301366 A1* | 10/2016 | Sato .......................... H03F 3/19 |
| 2018/0184388 A1* | 6/2018 | Kam ................... H04W 52/245 |
| 2020/0028435 A1 | 1/2020 | Kim et al. |
| 2020/0069287 A1* | 3/2020 | Hasegawa ............ A61B 8/4494 |
| 2020/0321711 A1 | 10/2020 | Baek et al. |
| 2020/0358405 A1 | 11/2020 | Tanaka et al. |

FOREIGN PATENT DOCUMENTS

| | | |
|---|---|---|
| JP | 2013-074369 | 4/2013 |
| JP | 2020-058211 | 4/2020 |
| KR | 10-1718236 | 3/2017 |
| KR | 10-2019-0073856 | 6/2019 |
| KR | 10-2020-0010830 | 1/2020 |

\* cited by examiner

| Subframe number | | | | | | | | | | Number of changed subframes |
|---|---|---|---|---|---|---|---|---|---|---|
| 0 | 1 | 2 | 3 | 4 | 5 | 6 | 7 | 8 | 9 | |
| D | S | U | U | U | D | S | U | U | U | 1 |
| D | S | U | U | D | D | S | U | U | D | 2 |
| D | S | U | D | D | D | S | U | D | D | 3 |
| D | S | U | U | U | D | D | D | D | D | 0 |
| D | S | U | U | D | D | D | D | D | D | 0 |
| D | S | U | D | D | D | D | D | D | D | 0 |
| D | S | U | U | U | D | S | U | U | D | 1 |

FIG.12

ELECTRONIC DEVICE FOR TRANSMITTING RADIO-FREQUENCY SIGNAL AND METHOD FOR OPERATING SAME

CROSS-REFERENCE TO RELATED APPLICATIONS

This application is a continuation of International Application No. PCT/KR2022/010748 designating the United States, filed on Jul. 22, 2022, in the Korean Intellectual Property Receiving Office and claiming priority to Korean Patent Application No. 10-2021-0102704, filed on Aug. 4, 2021, in the Korean Intellectual Property Office, the disclosures of which are incorporated by reference herein in their entireties.

BACKGROUND

Field

The disclosure relates to an electronic device for transmitting radio frequency (RF) signals and a method for operating the same.

Description of Related Art

An electronic device may transmit multiples kinds of RF signals. For example, a physical channel for RF signals may include at least one of a physical uplink shared channel (PUSCH), a physical uplink control channel (PUCCH), a physical random access channel (PRACH), and a sounding reference signal (SRS). The electronic device may transmit PUSCH RF signals, PUCCH RF signals, PRACH RF signals, and SRSs, respectively, using resources allocated for respective uplink channels.

Meanwhile, each uplink physical channel may have differently configured transmission power. As a result, RF signals corresponding to respective uplink physical channels may be transmitted respectively, thereby changing RF signal transmission power. An electronic device may include at least one power amplifier for amplifying RF signals. Modes for controlling the supply voltage (Vcc) applied to the power amplifier according to RF signal transmission power include an envelope tracking (ET) mode and an average power tracking (APT) mode. In the APT mode, the supply voltage may be controlled according to RF signal transmission power, and the supply voltage may be controlled in the slot (or subframe) time unit. In the ET mode, the supply voltage may be controlled by tracking RF signal transmission power in real time.

When an electronic device operates in the APT mode, a driving voltage (Vcc) based on the APT mode may be applied to a power amplifier. In the case of an APT-mode capacitor of the electronic device, charging and discharging may occur as a result of application of the driving voltage (Vcc) and suspension of application. As a result, the voltage applied to the APT-model capacitor may be applied to the power amplifier. On the other hand, charging and discharging that occur in the APT-mode capacitor may cause expansion and contraction of the dielectric material inside the APT-mode capacitor. The expansion and contraction of the dielectric material may generate vibration. The generated vibration may be delivers to peripheral components. If the frequency of corresponding vibration falls within the hearing range (for example, 20-20,000 Hz), this may be heard by the user as noise. Particularly, application of a relatively high voltage to the APT-mode capacitor and suspension of application may cause a relatively large amount of noise.

SUMMARY

An electronic device and a method for operating the same, according to various embodiments, may provide a driving voltage (Vcc) to a power amplifier even during a partial period of a period in which no RF signal is transmitted, if an event related to audible noise occurs.

According to various embodiments, an electronic device may include: at least one processor configured to output at least one baseband signal, a radio frequency integrated circuit (RFIC) configured to output at least one RF signal generated based on the at least one baseband signal, at least one power amplifier configured to amplify the at least one RF signal and to output the at least one amplified RF signal to at least one antenna, and at least one converter comprising circuitry configured to provide a driving voltage for amplifying the at least one RF signal to the power amplifier, wherein at least one capacitor is connected between at least part of the at least one converter and the at least one power amplifier, the at least one processor is configured to: set a driving voltage to be applied to a first power amplifier for amplifying a first RF signal provided from the RFIC among the at least one power amplifier, to be a first voltage based on an average power tracking (APT) mode, control at least part of the at least one converter to provide a first voltage, to be set based on the APT mode, to the first power amplifier during a transmission period of the first RF signal, and control at least part of the at least one converter to provide the first voltage to the first power amplifier during at least partial period of a remaining period in which no RF signal is transmitted based on the occurrence of an event associated with audible noise.

According to various embodiments, a method for operating an electronic device may include: setting a driving voltage to be applied to a first power amplifier for amplifying a first RF signal, to be a first voltage, based on an average power tracking (APT) mode, controlling at least part of at least one converter of the electronic device to provide the first voltage, based on the APT mode, to the first power amplifier during a transmission period of the first RF signal, and controlling at least part of the at least one converter to provide the first voltage to the first power amplifier during at least partial period of a remaining period in which no RF signal is transmitted, based on the occurrence of an event associated with audible noise.

Various embodiments may provide an electronic device and a method for operating the same, wherein a driving voltage (Vcc) may be provided to a power amplifier even during a partial period of a period in which no RF signal is transmitted, if an event related to audible noise occurs. This may suppress/reduce the occurrence of audible noise.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 12 illustrates a TDD configuration according to various embodiments;

DETAILED DESCRIPTION

Figure 1:
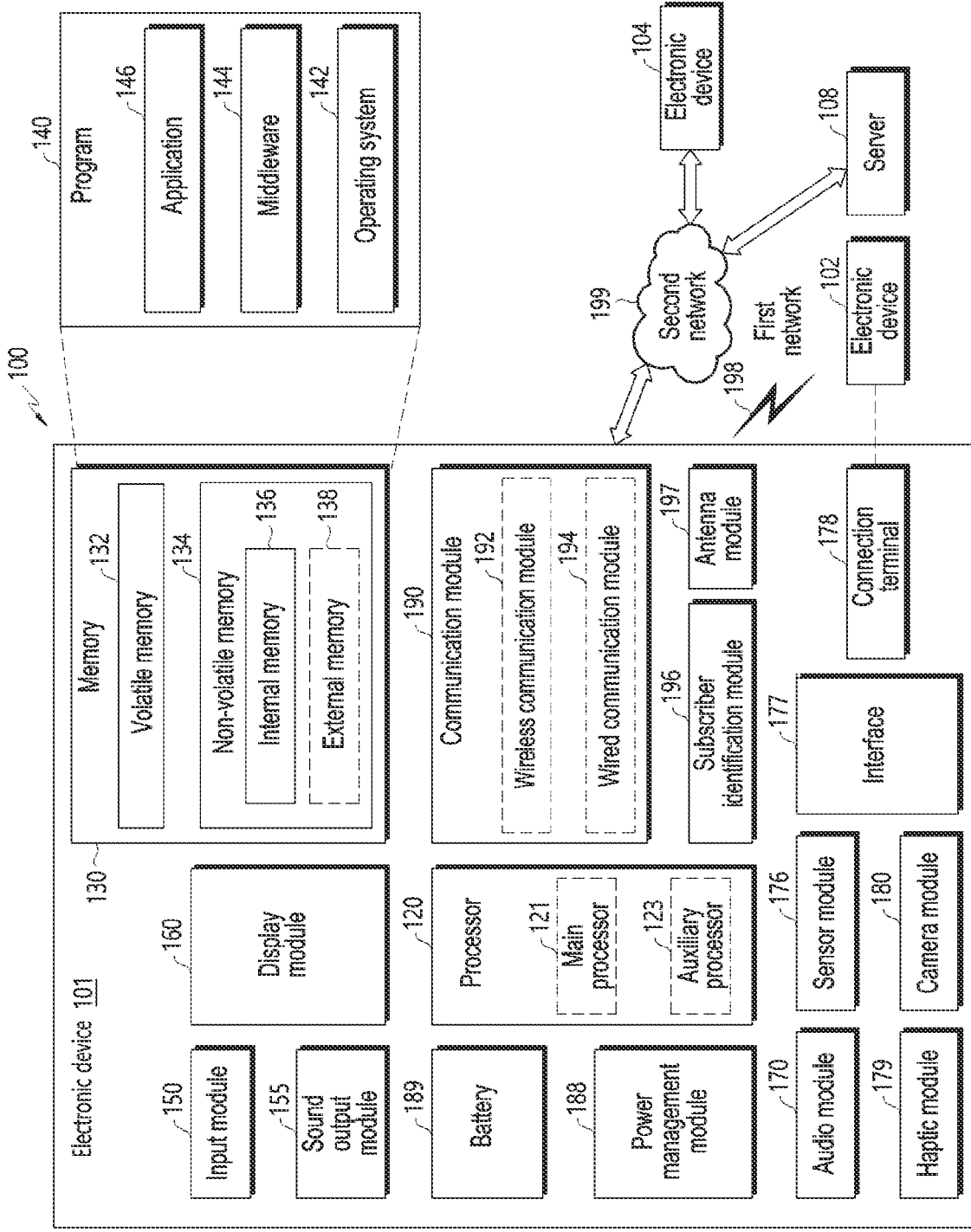
FIG. 1 is a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
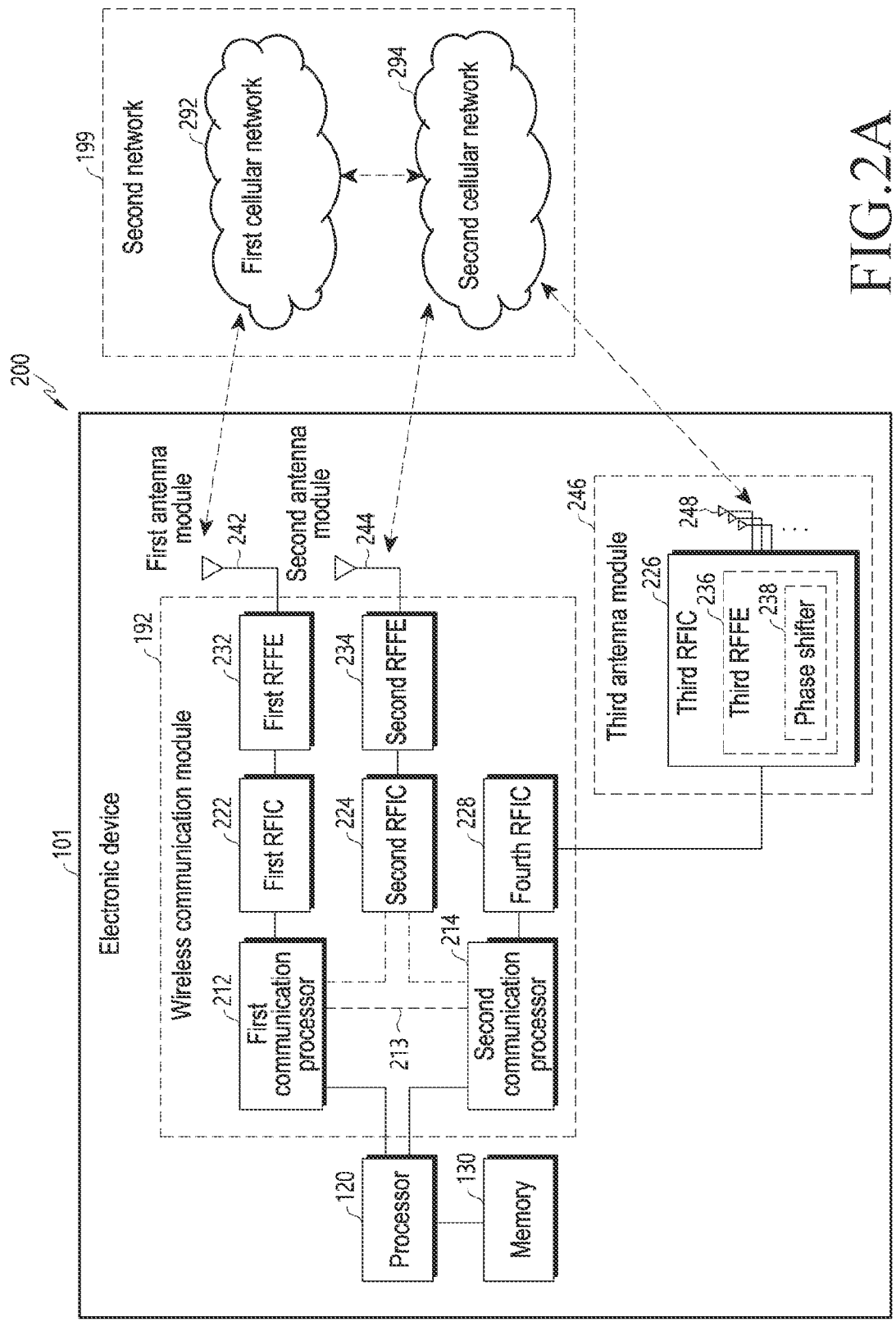
FIG. 2A is a block diagram of an electronic device for supporting legacy network communication and 5G network communication according to various embodiments.

FIG. 2A is a block diagram 200 of the electronic device 101 for supporting legacy network communication and 5G network communication according to various embodiments. Referring to FIG. 2A, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module (e.g., including at least one antenna) 242, a second antenna module (e.g., including at least one antenna) 244, a third antenna module (e.g., including at least one antenna) 246, and antennas 248. The electronic device 101 may further include the processor (e.g., including processing circuitry) 120 and the memory 130. The second network 199 may include a first cellular network 292 and a second cellular network 294. According to an embodiment, the electronic device 101 may further include at least one component of the components illustrated in FIG. 1, and the second network 199 may further include at least another network. According to an embodiment, the first communication processor 212, the second communication processor 214, the first RFIC 222, the second RFIC 224, the fourth RFIC 228, the first RFFE 232, and the second RFFE 234 may configure at least part of the wireless communication module 192. According to an embodiment, the fourth RFIC 228 may be omitted or included as part of the third RFIC 226.

The first communication processor 212 may include various processing circuitry and establish a communication channel of a band to be used for wireless communication with the first cellular network 292, and may support legacy network communication through the established communication channel According to various embodiments, the first cellular network may be a legacy network including a 2G network, a 3G network, a 4G network, and/or a long term evolution (LTE) network. The second communication processor 214 may include various communication circuitry and establish a communication channel corresponding to a designated band (e.g., approximately 6 GHz to approximately 60 GHz) of bands to be used for wireless communication with the second cellular network 294, and may support the 5G network communication over the established communication channel According to various embodiments, the second cellular network 294 may be a 5G network defined in the 3GPP. Additionally, according to an embodiment, the first communication processor 212 or the second communication processor 214 may establish a communication channel corresponding to another designated band (e.g., approximately 6 GHz or lower) of the bands to be used for wireless communication with the second cellular network 294, and may support the 5G network communication through the established communication channel.

The first communication processor 212 may transmit or receive data to or from the second communication processor 214. For example, data that has been classified to be transmitted through the second cellular network 294 may be changed to be transmitted through the first cellular network 292. Here, the first communication processor 212 may receive transmission data from the second communication processor 214. For example, the first communication processor 212 may transmit or receive data to or from the second communication processor 214 through an inter-processor interface 213. The inter-processor interface 213 may be implemented as, for example, a universal asynchronous receiver/transmitter (UART) (e.g., a high speed-UART (HS-UART)) or a peripheral component interconnect bus express (PCIe) interface, but there is no limitation in the kinds thereof. Alternatively, the first communication processor 212 and the second communication processor 214 may exchange control information and packet data information using, for example, a shared memory. The first communication processor 212 may transmit or receive various information, such as sensing information, information on output strength, resource block (RB) allocation information, and the like, to or from the second communication processor 214.

Depending on the implementation, the first communication processor 212 may not be directly connected to the second communication processor 214. Here, the first communication processor 212 may transmit or receive data to or from the second communication processor 214 through the processor 120 (e.g., application processor). For example, the first communication processor 212 and the second communication processor 214 may transmit or receive data to or from the processor 120 (e.g., an application processor) through an HS-UART interface or a PCIe interface, but there is no limitation in the kinds of the interface. Alternatively, the first communication processor 212 and the second communication processor 214 may exchange control information and packet data information with the processor 120 (e.g., application processor) using a shared memory.

Figure 2B:
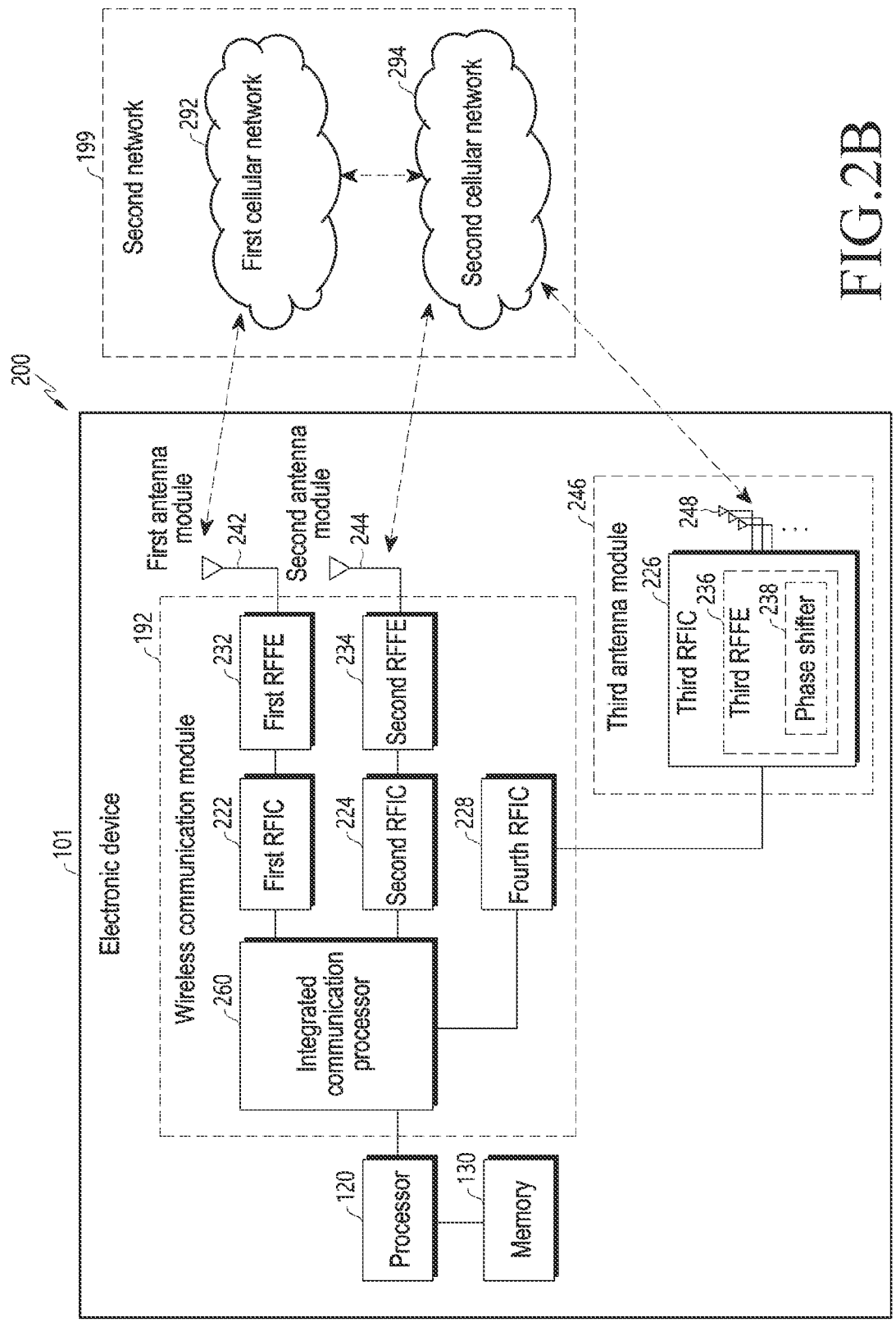
FIG. 2B is a block diagram of an electronic device for supporting legacy network communication and 5G network communication according to various embodiments.

According to an embodiment, the first communication processor 212 and the second communication processor 214 may be implemented in a single chip or a single package. According to various embodiments, the first communication processor 212 or the second communication processor 214 may be configured in the form of a single chip or a single package with the processor 120, an auxiliary coprocessor 123, or a communication module 190. For example, as shown in FIG. 2B, an integrated communication processor 260 may include various processing circuitry and support both a function for communication with the first cellular network 292 and a function for communication with the second cellular network 294.

Upon transmission, the first RFIC 222 may convert a baseband signal generated by the first communication processor 212 into a radio frequency (RF) signal of about 700 MHz to about 3 GHz used in the first cellular network 292 (e.g., a legacy network). Upon reception, the RF signal may be obtained from the first cellular network 292 (e.g., a legacy network) via an antenna (e.g., the first antenna module 242) and may be preprocessed through an RFFE (e.g., the first RFFE 232). The first RFIC 222 may convert the preprocessed RF signal into a baseband signal so as to be processed by the first communication processor 212.

Upon transmission, the second RFIC 224 may convert a baseband signal generated by the first communication processor 212 or the second communication processor 214 into an RF signal in a Sub6 band (hereinafter, referred to as "5G Sub6 RF signal") (e.g., about 6 GHz or less) used in the second cellular network 294 (e.g., 5G network). Upon reception, the 5G Sub6 RF signal may be obtained from the second cellular network 294 (e.g., 5G network) through an antenna (e.g., the second antenna module 244), and may be preprocessed through an RFFE (e.g., the second RFFE 234). The second RFIC 224 may convert the preprocessed 5G Sub6 RF signal into a baseband signal so as to be processed by the corresponding communication processor of either the first communication processor 212 or the second communication processor 214.

The third RFIC 226 may convert a baseband signal generated by the second communication processor 214 into an RF signal in a 5G Above6 band (e.g., about 6 GHz to about 60 GHz) (hereinafter, referred to as "5G Above6 RF signal") to be used in the second cellular network 294 (e.g., 5G network). Upon reception, the 5G Above6 RF signal may be obtained from the second cellular network 294 (e.g., 5G network) through an antenna (e.g., the antenna 248), and may be preprocessed through the third RFFE 236. The third RFIC 226 may convert the preprocessed 5G Above RF signal into a baseband signal so as to be processed by the second communication processor 214. According to an embodiment, the third RFFE 236 may be configured as part of the third RFIC 226.

According to an embodiment, the electronic device 101 may include the fourth RFIC 228, separately from or as at least part of the third RFIC 226. Here, the fourth RFIC 228 may convert a baseband signal generated by the second communication processor 214 into an RF signal in an intermediate frequency band (hereinafter, referred to as "IF signal") (e.g., about 9 GHz to about 11 GHz), and may then transmit the IF signal to the third RFIC 226. The third RFIC 226 may convert the IF signal into the 5G Above6 RF signal. Upon reception, the 5G Above6 RF signal may be received from the second cellular network 294 (e.g., 5G network) via an antenna (e.g., antenna 248), and may be converted into an IF signal by the third RFIC 226. The fourth RFIC 228 may convert the IF signal into a baseband signal so as to be processed by the second communication processor 214.

According to an embodiment, the first RFIC 222 and the second RFIC 224 may be implemented as at least part of a single chip or a single package. According to various embodiments, when the first RFIC 222 and the second RFIC 224 in FIG. 2A or 2B are implemented as a single chip or a single package, they may be implemented as an integrated RFIC. Here, the integrated RFIC may be connected to the first RFFE 232 and the second RFFE 234 to convert a baseband signal into a signal of a band supported by the first RFFE 232 and/or the second RFFE 234, and may transmit the converted signal to one of the first RFFE 232 and the second RFFE 234. According to an embodiment, the first RFFE 232 and the second RFFE 234 may be implemented as at least part of a single chip or a single package. According to an embodiment, at least one antenna module either the first antenna module 242 or the second antenna module 244 may be omitted or combined with another antenna module to process RF signals of a corresponding plurality of bands.

According to an embodiment, the third RFIC 226 and the antenna 248 may be arranged on the same substrate to form a third antenna module 246. For example, the wireless communication module 192 or the processor 120 may be arranged on a first substrate (e.g., main PCB). Here, the third antennal module 246 may be formed in a way of arranging the third RFIC 226 in one region (e.g., lower surface) of a second substrate (e.g., sub PCB) in separation from the first substrate and arranging the antenna 248 in another region (e.g., upper surface) of the second surface. By arranging the third RFIC 226 and the antenna 248 in the same substrate, it is possible to reduce the length of a transmission line therebetween. This may reduce, for example, a loss (e.g., attenuation) of a signal in a high frequency band (e.g., about 6 GHz to about 60 GHz) used for 5G network communication due to the transmission line. Accordingly, the electronic device 101 can improve the quality or speed of communication with the second cellular network 294 (e.g., 5G network).

According to an embodiment, the antenna 248 may be configured in the form of an antenna array including a plurality of antenna elements that may be used for beamforming. Here, the third RFIC 226 may include a plurality of phase shifters 238 corresponding to the plurality of antenna elements, for example, as part of the third RFFE 236. Upon transmission, each of the plurality of phase shifters 238 may convert the phase of a 5G Above6 RF signal to be transmitted to the outside of the electronic device 101 (e.g., a base station (BS) of a 5G network) through a corresponding antenna element. Upon reception, each of the plurality of phase shifters 238 may convert the phase of the 5G Above6 RF signal received from the outside into the same or substantially the same phase through the corresponding antenna element. This may enable transmission or reception through beamforming between the electronic device 101 and the outside.

The second cellular network 294 (e.g., 5G network) may operate independently of (e.g., stand-alone (SA)) the first cellular network 292 (e.g., legacy network), or may operate in conjunction with the first cellular network 292 (e.g., non-standalone (NSA)). For example, in the 5G network, there may be only an access network (e.g., 5G radio access network (RAN) or next generation RAN (NG RAN)), but there may be no core network (e.g., next generation core (NGC)). Here, the electronic device 101 may access the access network of a 5G network and then access an external network (e.g., the Internet) under the control of a core network (e.g., evolved packed core (EPC)) of a legacy network. Protocol information (e.g., LTE protocol information) for communication with the legacy network or protocol information (e.g., new radio (NR) protocol information) for communication with the 5G network may be stored in the memory 230, and may be accessed by other components (e.g., the processor 120, the first communication processor 212, or the second communication processor 214).

Figure 3A:
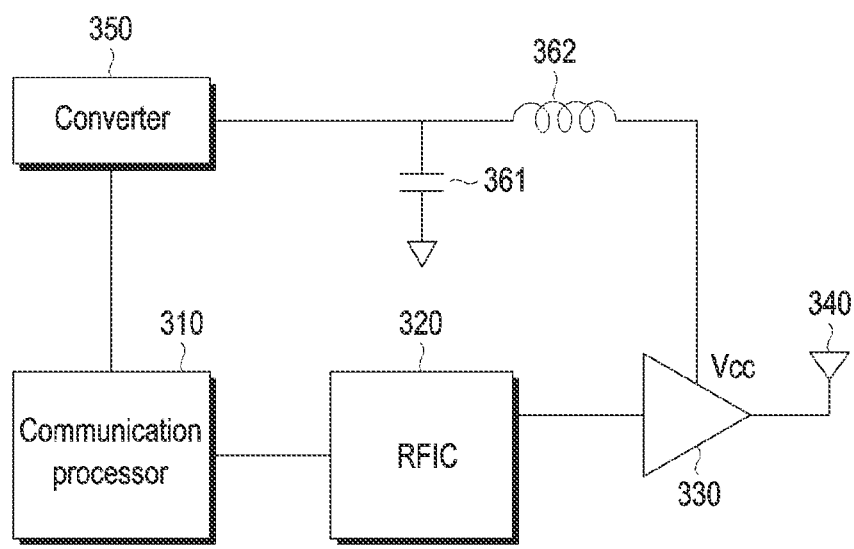
FIG. 3A is a block diagram of an electronic device including a power amplifier according to various embodiments.
Figure 4A:
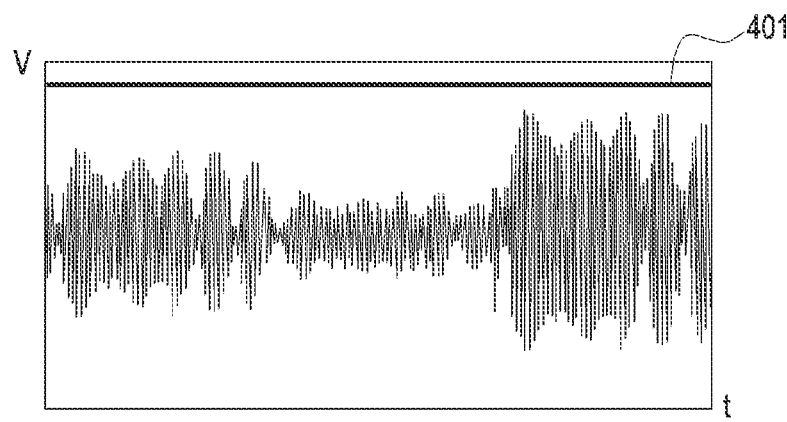
FIGS. 4A, 4B and 4C illustrate an operation mode of a modulator according to various embodiments.
Figure 4B:
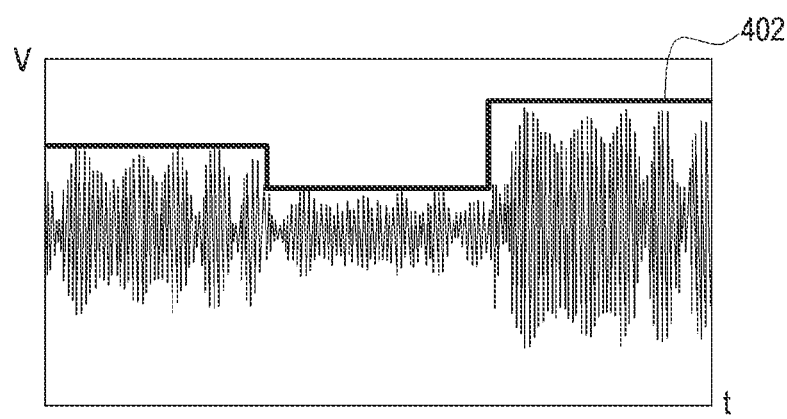
Figure 4C:
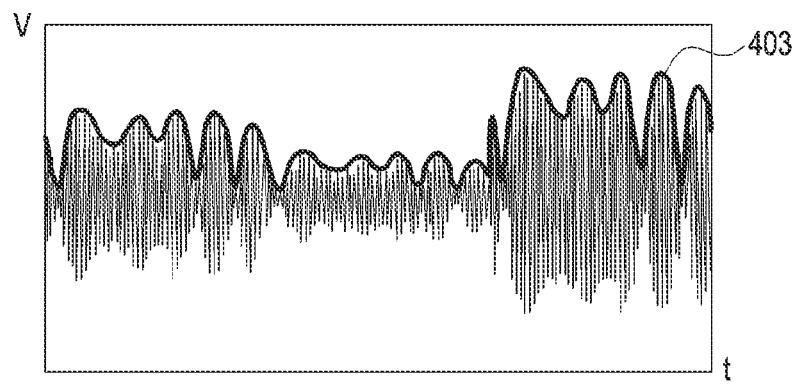

FIG. 3A illustrates a block diagram of an electronic device including a power amplifier according to various embodiments. The embodiment of FIG. 3A will be described in more detail with reference to FIGS. 4A, 4B and 4C. FIGS. 4A to 4C are diagrams for explaining an operation mode of a modulator according to various embodiments.

According to various embodiments, the electronic device 101 may include at least one of a communication processor (e.g., including processing circuitry) 310, a radio frequency integrated circuit (RFIC) 320, a power amplifier 330, an antenna 340, a converter (e.g., including various converting circuitry) 350, a capacitor 361, and/or an inductor 362.

According to various embodiments, the communication processor 310 (e.g., at least one of the first communication processor 212, the second communication processor 214, or the integrated communication processor 260) may provide a baseband signal for transmission to the RFIC 320 (e.g., at least one of the first RFIC 222, the second RFIC 224, the third RFIC 226, or the fourth RFIC 228). The communication processor 310 may receive and process a baseband signal for reception from the RFIC 320.

According to various embodiments, the RFIC 320 may generate, for example, an RF signal corresponding to a baseband signal for transmission and provide the RF signal to the power amplifier 330. In FIG. 3A, the baseband signal for transmission is illustrated as being provided to the RFIC 320 through a single line, but this is exemplary. It will be understood by those skilled in the art that a baseband signal of an in-phase (I) component and a quadrature (Q) component can be provided to the RFIC 320. The power amplifier 330 may be included in an RFFE (e.g., at least one of the first RFFE 232, the second RFFE 234, or the third RFFE 236). The RFFE may be configured in the form of a power amplifier module (PAM), a front end module (FEM), a power amplifier module including duplexer (PAMiD), LNA and PAM with integrated duplexer or diplexer (LPAMID), or a PA with integrated low noise amplifier and filter (LPAMIF), and there is no limitation on the form of implementation. In FIG. 3A, the power amplifier 330 is illustrated as being connected to the RFIC 320, but it will be understood by those skilled in the art that a filter and/or an antenna switching module (ASM) in addition to the power amplifier 330 may be implemented to be further included in the RFFE. Meanwhile, in FIG. 3A, one RFIC 320, one power amplifier 330, and one antenna 340 are illustrated as being included in the electronic device 101, but this is for convenience of description. Those skilled in the art will understand that multiple RFICs, power amplifiers, and antennas can be implemented to be included in the electronic device 101.

According to various embodiments, the converter 350 (e.g., at least one of a buck/boost converter, a buck converter, or a boost converter) may provide supply voltage Vcc to the power amplifier 330 using the supplied power. The power amplifier 330 may amplify an RF signal provided from the RFIC 320 using the supply voltage (Vcc). The converter 350 may be configured to operate according to an APT mode, for example. The converter 350 may operate in a direct mode or an ET mode. When operating in the ET mode, the converter 350 may be replaced by a linear amplifier, which will be described with reference to FIG. 3B. In one example, when operating according to a direct mode, supply voltage Vcc 401 of the power amplifier 330 may be configured to be a designated value as shown in FIG. 4A. In the direct mode, the supply voltage 401 of a designated value may be provided to the power amplifier 330 regardless of the magnitude of transmission power for each signal. In this case, wasted power consumption may be relatively large. In another example, when operating according to an APT mode, supply voltage Vcc 402 of the power amplifier 330 may be configured (or changed) according to a designated time unit (e.g., a slot (or subframe)) as shown in FIG. 4B. For example, with regard to a subframe (or slot) in which the transmission power of the RF signal is configured as 10 to 18 dBm, supply voltage Vcc of 3V may be supplied to the power amplifier 330, and with regard to a subframe (or slot) in which the transmission power of the RF signal is configured as 18 to 24 dBm, supply voltage Vcc of 4V may be supplied to the power amplifier 330. In another example, when operating according to the ET mode, supply voltage Vcc 403 of the power amplifier 330 may be configured (or changed) in real time according to the magnitude of the transmission power of the RF signal as shown in FIG. 4C. When operating in the ET mode, the converter 350 may be configured to track the transmission power of the RF signal in real time, and to provide a supply voltage corresponding to an envelope of the transmission power to the power amplifier 330. A time interval of configuring (or changing) the supply voltage Vcc in the ET mode may be shorter than a time interval of configuring (or changing) the supply voltage Vcc in the APT mode. The communication processor 310 (or modulator) may determine the magnitude of supply voltage configured in the APT mode or the ET mode, using, for example, a value ($\sqrt{I^2+Q^2}$) based on the I/Q signal of the baseband signal. Although not shown, the electronic device 101 may include at least one of an envelope detector, an envelope shaper, and an amplifier, but is not limited thereto.

According to various embodiments, the converter 350 may provide the supply voltage Vcc to the power amplifier 330 to perform transmission of the RF signal according to the APT mode. For example, the converter 350 may include a switch. The on-duration and off-duration (or a ratio of on-duration and off-duration) of the switch may be determined according to the determined magnitude of the supply voltage Vcc. However, it will be understood by those skilled in the art that there is no limitation on the method in which the converter 350 controls the magnitude of the supply voltage Vcc. For example, in case that RF signals of an ultra-high band (UHB) or an operation band having a relatively wide bandwidth (e.g., B48 band, B42 band, N48 band, N41 band, N77 band, N78 band, or N79 band) are transmitted, the APT mode may be used, but there is no limitation. The converter 350 may control the charge amount and/or the discharge amount of the capacitor 361 in order to supply the determined supply voltage Vcc.

Figure 3B:
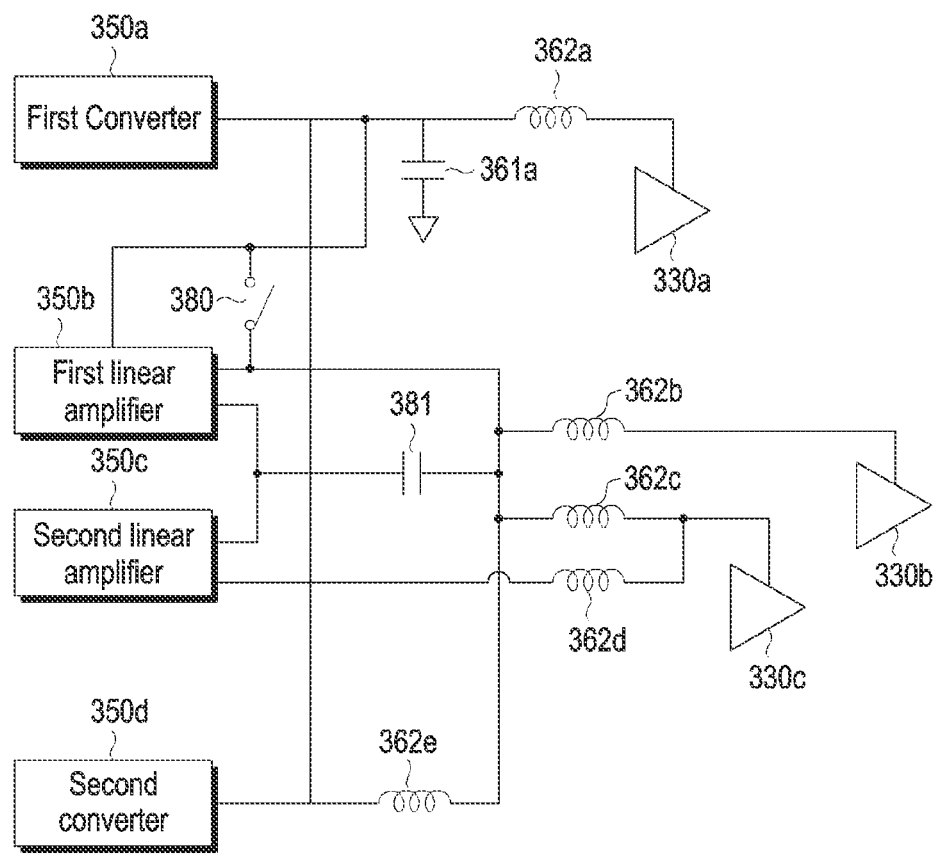
FIG. 3B is a block diagram of an electronic device including a power amplifier according to various embodiments.

FIG. 3B illustrates a block diagram of an electronic device including a power amplifier according to various embodiments.

According to various embodiments, the electronic device 101 may include at least one of a first converter (e.g., including various converting circuitry) 350a, a first linear amplifier 350b, a second linear amplifier 350c, and a second converter (e.g., including various converting circuitry) 350d. A capacitor 361a may be connected to the first converter 350a. The first converter 350a may be connected to a power amplifier 330a through a coil 362a. The first converter 350a may include, for example, a buck/boost converter, but there is no limitation thereto. The first converter 350a may apply or interrupt the application of the drive voltage Vcc determined according to, for example, the APT mode, to the capacitor 361a using the voltage from the battery 189 (or PMIC). The driving voltage Vcc applied to the capacitor 361a may be input to the power amplifier 330a. In the APT mode, the magnitude of the driving voltage Vcc may be determined, for example, in units of 1 ms, but there is no limitation thereto. When the capacitor 361a does not exist, the output voltage may be switched instead of being output as a predetermined value. Accordingly, the capacitor 361a may be an element required in the APT mode. The power amplifier 330a may be used dedicatedly for the APT mode and may be used when amplification of an RF signal of the N79 band is required for example, but there is no limitation thereto.

According to various embodiments, a switch 380 may selectively connect the capacitor 361a to a power amplifier 330b and/or a power amplifier 330c. For example, the driving voltage Vcc determined according to either the APT mode or the ET mode may be applied to the power amplifier 330b and/or the power amplifier 330c. When the power amplifier 330b and/or the power amplifier 330c operates in the APT mode, the switch 380 may be controlled to be in on state. For example, the power amplifier 330b may amplify an RF signal based on a first radio access technology (RAT) (e.g., E-UTRA), and the power amplifier 330c may amplify an RF signal based on a second RAT (e.g., NR), but there is no limitation thereto. When the RF signal based on the first RAT (e.g., E-UTRA) is determined to be processed in the APT mode, the driving voltage Vcc, which is applied to the capacitor 361a by the first converter 350a, may be provided to the power amplifier 330b through the switch 380 and a coil 362b. When the RF signal based on the second RAT (e.g., NR) is determined to be processed in the APT mode, the driving voltage Vcc, which is applied to the capacitor 361a by the first converter 350a, may be provided to the power amplifier 330c through the switch 380 and a coil 362c.

Meanwhile, when the power amplifier 330b and/or the power amplifier 330c operates in the ET mode, the switch 380 may be controlled to be in off state. When the switch 380 is controlled to be in off state, the linear amplifiers 350b and 350c may provide driving voltage Vcc that changes in real time to the power amplifier 330b and/or the power amplifier 330c. The linear amplifier 350b may provide driving voltage Vcc for amplification of the RF signal based on the first RAT (e.g., E-UTRA), and may provide driving voltage Vcc for amplification of the RF signal based on the second RAT (e.g., NR), but there is no limitation thereto. The second converter 350d may be implemented as a slow converter in one example, and may provide DC current. The second converter 350d may operate in the ET mode and may not operate in the APT mode. The second converter 350d may be connected to a capacitor 381 through a coil 362e. The linear amplifiers 350b and 350c may be connected to a capacitor 381. The capacitor 381 may be connected to each of the power amplifiers 330b and 330c through the coil 362b and the coil 362c. The linear amplifier 350c may be connected to the power amplifier 330c through a coil 362d.

Figure 5A:
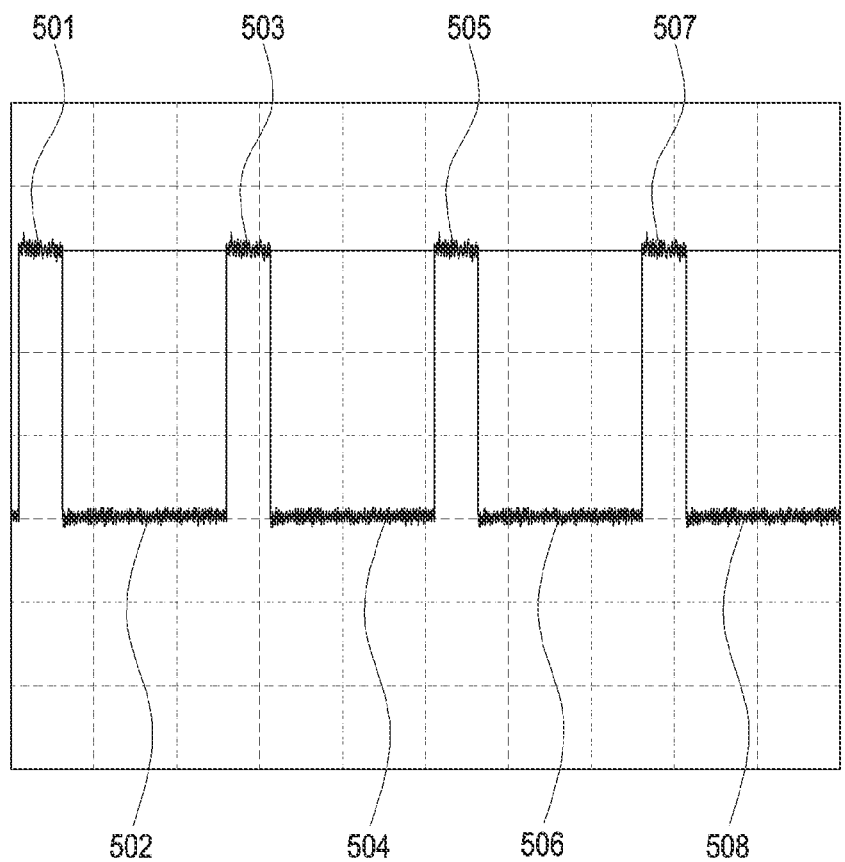
FIG. 5A illustrates a graph of voltage applied to a capacitor connected to a power amplifier according to various embodiments.

FIG. 5A illustrates a graph of voltage applied to a capacitor connected to a power amplifier according to various embodiments.

Figure 5B:
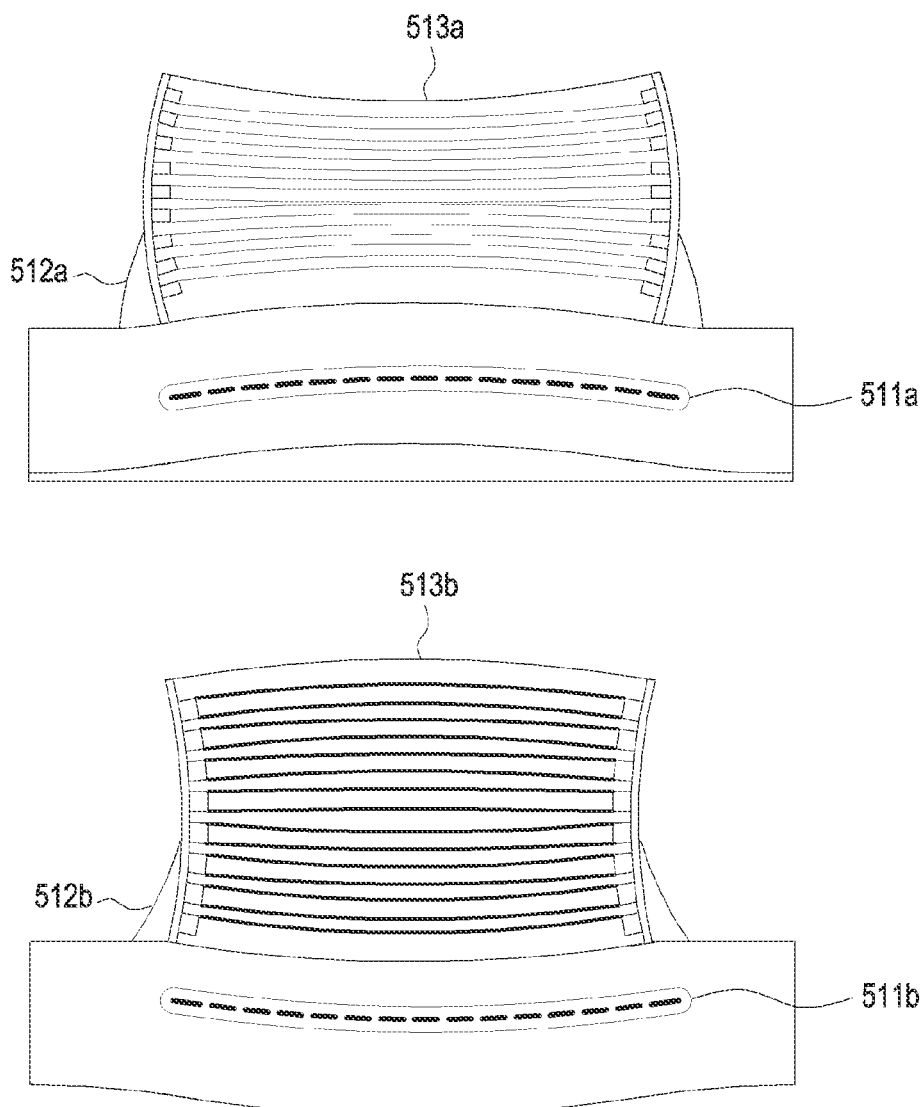
FIG. 5B is a cross-sectional view of a capacitor during charge and discharge according to various embodiments.

According to various embodiments, a capacitor (e.g., the capacitor 361 of FIG. 3A or the capacitor 361a of FIG. 3B) may be applied with the driving voltage Vcc of a power amplifier (e.g., the power amplifier 330 of FIG. 3A, or the power amplifiers 330a, 330b, and 330c of FIG. 3B) for amplification of RF signals. As shown in FIG. 5B, driving voltages Vcc 501, 503, 505, and 507 may be applied to a capacitor (e.g., the capacitor 361 of FIG. 3A or the capacitor 361a of FIG. 3B) during a period in which the RF signal is transmitted (e.g., a transmission period). On the other hand, as the capacitor (e.g., the capacitor 361 of FIG. 3A or the capacitor 361a of FIG. 3B) is discharged during a period in which the RF signal is not transmitted (e.g., a non-transmission period), floating voltages 502, 504, 506, and 508 may be applied thereto. According to the charge and discharge of the capacitor (e.g., the capacitor 361 of FIG. 3A or the capacitor 361a of FIG. 3B), audible noise may occur, which will be described with reference to FIG. 5B.

FIG. 5B is a cross-sectional view of a capacitor during charge and discharge according to various embodiments.

As described above, a capacitor (e.g., the capacitor 361 of FIG. 3A or the capacitor 361a of FIG. 3B) may be charged during a transmission period and discharged during a non-transmission period. For example, during discharging, the capacitor (e.g., the capacitor 361 of FIG. 3, or the capacitor 361a of FIG. 3B) may be configured to have a first shape 513a, and during charging, the capacitor (e.g., the capacitor 361 of FIG. 3A, or the capacitor 361a of FIG. 3B) may be configured to have a second shape 513b. A change in shape according to charge and discharge of the capacitor (e.g., the capacitor 361 of FIG. 3A or the capacitor 361a of FIG. 3B) may cause change in the shape of surrounding hardware, such as a PCB or solder. For example, in case that the capacitor (e.g., the capacitor 361 of FIG. 3, or the capacitor 361a of FIG. 3B) has the first shape 513a, the PCB has a first shape 511a, and the solder may have a first shape 512a. For example, in case that the capacitor (e.g., the capacitor 361 of FIG. 3A, or capacitor 361a of FIG. 3B) has a second shape 513b, the PCB has a second shape 511b, and the solder may have a second shape 512b. Vibration may occur according to the change in the shape as described above, and when the frequency of the vibration is included in an audible band (20 to 20000 Hz), audible noise may be heard by a user. When the capacitor (e.g., the capacitor 361 of FIG. 3A, or the capacitor 361a of FIG. 3B) is disposed close to a receiver of the electronic device 101, audible noise is heard during a phone call, and thus call quality may deteriorate. For example, in a case of miniaturized electronic device 101, the mounting area is small, and thus the distance between the capacitor (e.g., the capacitor 361 of FIG. 3A, or the capacitor 361a of FIG. 3B) and the receiver may be designed to be very close, which may cause call quality deterioration. In addition, when an operating frequency band requiring a relatively high transmission power and/or an operating frequency band supporting a relatively wide bandwidth is used, a relatively high driving voltage Vcc may be required. For example, the B38 frequency band having a bandwidth of 10 MHz may require a relatively low driving voltage Vcc of 2.9 V when a target transmission power is 23 dBm. However, for example, the B48 frequency band having a bandwidth of 20 MHz may require a relatively high driving voltage Vcc of 4.4 V when the target transmission power is 24 dBm. For example, the N41 frequency band having a bandwidth of 50 MHz or more may require a relatively high driving voltage Vcc of 5.0 V when the target transmission power is 26 dBm. When a relatively high driving voltage Vcc is applied to the capacitor (e.g., the capacitor 361 of FIG. 3A, or the capacitor 361a of FIG. 3B) and then discharged, the voltage difference during charge and discharge may also relatively large. The relatively large voltage difference during charge and discharge may cause a relatively large audible noise.

Figure 6:
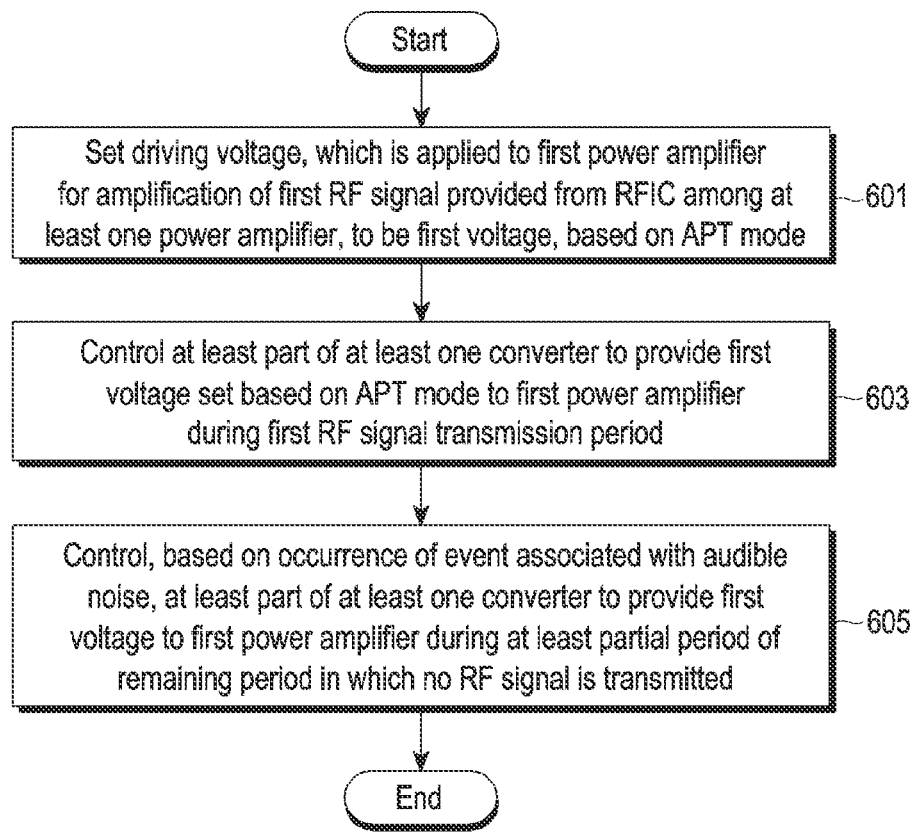
FIG. 6 is a flowchart illustrating a method for operating an electronic device according to various embodiments.

FIG. 6 is a flowchart illustrating a method for operating an electronic device according to various embodiments.

According to various embodiments, the electronic device 101 (e.g., at least one of the processor 120, the first communication processor 212, the second communication processor 214, the integrated communication processor 260, or the communication processor 310) may set a driving voltage, which is applied to a first power amplifier for amplification of a first RF signal provided from an RFIC among at least one power amplifier, to be a first voltage, based on an APT mode, in operation 601. For example, the electronic device 101 may configure the first voltage based on the average of output power in the APT mode, but there is no limitation on the configuration method. For example, the electronic device 101 may determine the first power amplifier based on the operating frequency band of the RF signal. The determination of the first power amplifier may be understood as, for example, determination of a transmission (TX) RF path. The TX RF path may be established based on a plurality of hardware sets for transmission of RF signals. For example, in FIG. 3A, the RFIC 320, the power amplifier 330, and the antenna 340 may be selected as the TX RF path for transmission of the first RF signal. In the embodiment of FIG. 3B, the power amplifier (or TX RF path) may be selected based on the operating frequency and/or RAT. For example, when the N79 band is used, the electronic device 101 may select the power amplifier 330a. For example, when the B1 band is used, the electronic device 101 may select the power amplifier 330b. For example, when the N78 band is used, the electronic device 101 may select the power amplifier 330c. For example, the electronic device 101 may configure the APT mode based on the operating frequency band of the RF signal. When the N79 band is used, the electronic device 101 may configure the APT mode. Meanwhile, when the electronic device 101 selects the power amplifiers 330b and 330c in which both the APT mode and the ET mode can be used, the electronic device 101 may configure a mode according to a target transmission power, but there is no limitation on the criteria for configuration of the APT mode. For example, when the APT mode is configured, the electronic device 101 may control the switch 380 of FIG. 3B to be in on state.

According to various embodiments, in operation 603, the electronic device 101 may be configured to control at least part of the at least one converter to provide the first voltage configured based on the APT mode to the first power amplifier during a transmission period of the first RF signal. In operation 605, the electronic device 101 may be configured to control, based on the occurrence of an event associated with audible noise, at least part of the at least one converter to provide the first voltage to the first power amplifier during at least a partial period of the remaining period in which no RF signal is transmitted. Providing the first voltage to the first power amplifier is a simple example. The electronic device 101 according to various embodiments may be configured to provide a second voltage, which is different from the first voltage provided during the transmission period, to the power amplifier during a non-transmission period. For example, when the difference between the second voltage and the first voltage is equal to or less than a threshold magnitude, audible noise may not occur. In various embodiments of the disclosure, application of the first voltage during a non-transmission period may be replaced by application of a second voltage different from the first voltage. For example, the electronic device 101 may determine that an event has been detected when the first voltage satisfies a designated condition, which will be described with reference to FIG. 7A. For example, when the transmission power satisfies a designated condition, the electronic device 101 may determine that an event has been detected, which will be described with reference to FIG. 7B. For example, the event may be an event associated with a speaker (or receiver) capable of generating audible noise due to charge and discharge of a capacitor. In one example, the event may be proximity detection by a proximity sensor disposed corresponding to the position of the speaker (or receiver). The communication processor 310 may receive, for example, information indicating proximity or not, directly (or through the processor 120) from the proximity sensor, and may determine that the reception of the information as the occurrence of event. In one example, the event may be performance of a VoIP service (e.g., VoLTE, VoNR, and VoWiFi). In one example, the event may be execution of an application for sound output. The communication processor 310 may receive, for example, information indicating execution of an application for sound output from the processor 120, and may determine that the reception of the information as the occurrence of event. In one example, the event may be obtaining of information indicating a speaker and/or an operation of the speaker. Meanwhile, it will be understood by those skilled in the art that there is no limitation as the event if it is a condition capable of determining the sound output through the speaker (or receiver). On the other hand, it will be understood by those skilled in the art that the above-described examples of the event may be implemented as one or more combinations thereof.

According to various embodiments, the electronic device 101 may be configured to, based on the occurrence of an event, control at least part of the at least one converter to provide a first voltage to a first power amplifier during at least a partial period of a remaining period in which no RF signal is transmitted (e.g., a non-transmission period). In one example, the electronic device 101 may be configured to, based on the occurrence of an event, control at least part of the at least one converter to provide the first voltage to the first power amplifier during a remaining period in which no RF signal is transmitted and a period in which the RF signal is transmitted, that is, during the entire period of time. The electronic device 101 may control at least part of the at least one converter to provide the first voltage to the first power amplifier during the entire period of time until cancellation of the event is detected. In an embodiment, the electronic device 101 may be configured to, based on the occurrence of an event, control at least part of the at least one converter to provide the first voltage to the first power amplifier during at least a portion of the remaining period in which no RF signal is transmitted. For example, the electronic device 101 may control at least part of the at least one converter to provide the first voltage to the first power amplifier during a downlink frame located between uplink frames, which will be described later.

Figure 7A:
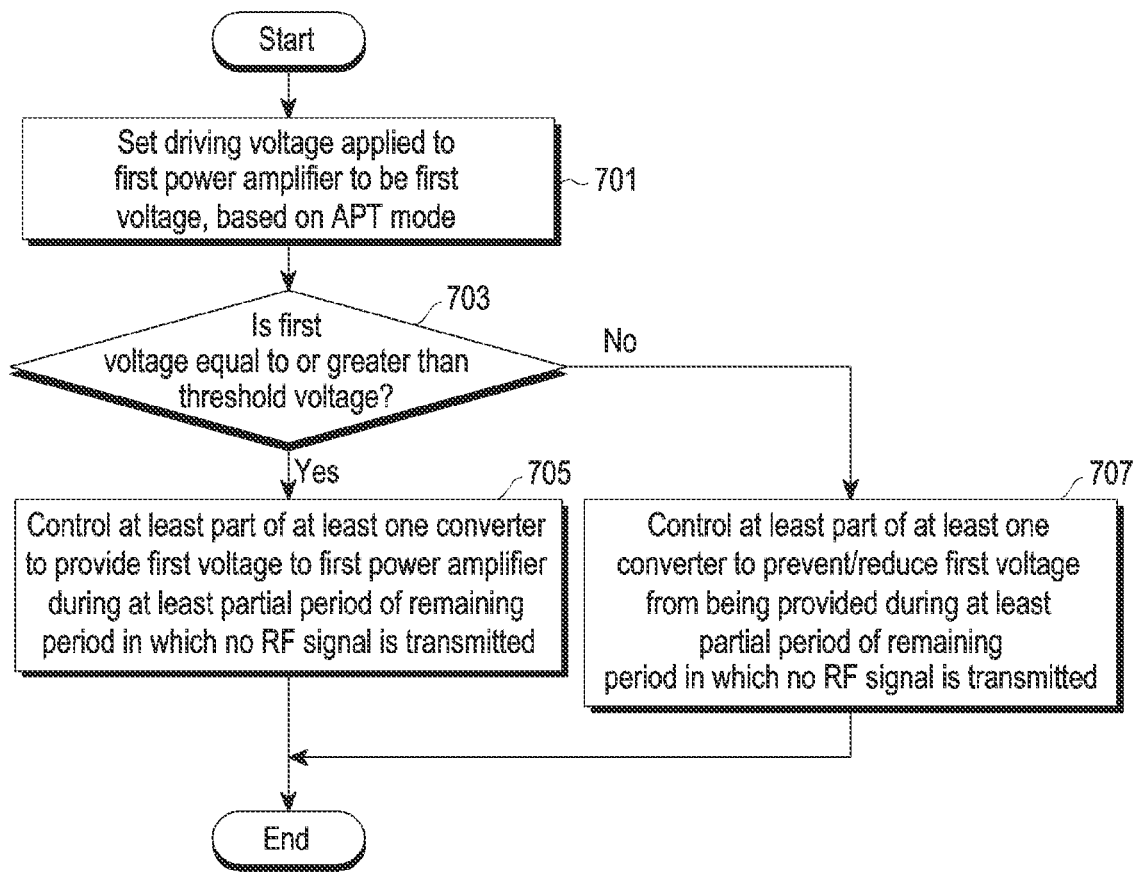
FIG. 7A is a flowchart illustrating a method for operating an electronic device according to various embodiments.

FIG. 7A is a flowchart illustrating a method for operating an electronic device according to various embodiments.

According to various embodiments, the electronic device 101 (e.g., at least one of the processor 120, the first communication processor 212, the second communication processor 214, the integrated communication processor 260, or the communication processor 310) may set a driving voltage, which is applied to a first power amplifier, to be a first voltage, based on an APT mode, in operation 701. In operation 703, the electronic device 101 may determine whether the first voltage is equal to or greater than a threshold voltage. The electronic device 101 may determine that the event has been detected, based on the determination that the first voltage is equal to or greater than a threshold voltage. In one example, the electronic device 101 may store one threshold voltage (e.g., 3.3V). A value, which has a designated difference (e.g., 2V) from a floating voltage identified during the interruption of applying the threshold voltage, may be configured as the threshold voltage, but there is no limitation to a method for configuring the threshold voltage. Accordingly, when a driving voltage, which has a designated difference (e.g., 2V) or more from the floating voltage, is applied, the event may be determined to have been detected. In another example, the threshold voltage may be configured differently for each RAT and/or operating frequency band, and the threshold voltage may be variable.

According to various embodiments, the electronic device 101 may be configured to, based on the first voltage being equal to or greater than a threshold voltage ("Yes" in operation 703), control at least part of the at least one converter to provide the first voltage to the first power amplifier during at least a partial period of a remaining period in which no RF signal is transmitted, in operation 705. As described above, when the first voltage is equal to or greater than the threshold voltage, the electronic device 101 may be configured to control at least part of the at least one converter to provide the first voltage to the first power amplifier during the entire period of time, or to control at least part of the at least one converter to provide the first voltage to the first power amplifier during a partial period of a non-transmission period. Based on the first voltage being less than the threshold voltage ("No" in 703), the electronic device 101 may be configured to control at least part of the at least one converter to prevent and/or reduce the first voltage from being provided during at least partial period of the remaining period in which no RF signal is transmitted, in operation 707. The electronic device 101 may be configured to control at least part of the at least one converter to provide the first voltage to the first power amplifier while the RF signal is being transmitted. As described above, as the difference between the threshold voltage and the floating voltage increases, the difference in shape during contraction and expansion of the capacitor may be large, and thus a larger vibration may be caused. Accordingly, in the electronic device 101, when the first voltage is equal to or greater than the threshold voltage, audible noise is highly likely to be generated, and thus the first voltage may be applied during at least a portion of a non-transmission period. On the other hand, when the first voltage is less than the threshold voltage, the possibility of generating audible noise is low (or the possibility that a user hears the audible noise is low), and thus the application of the first voltage may not be performed during the non-transmission period so as to reduce current consumption.

Figure 7B:
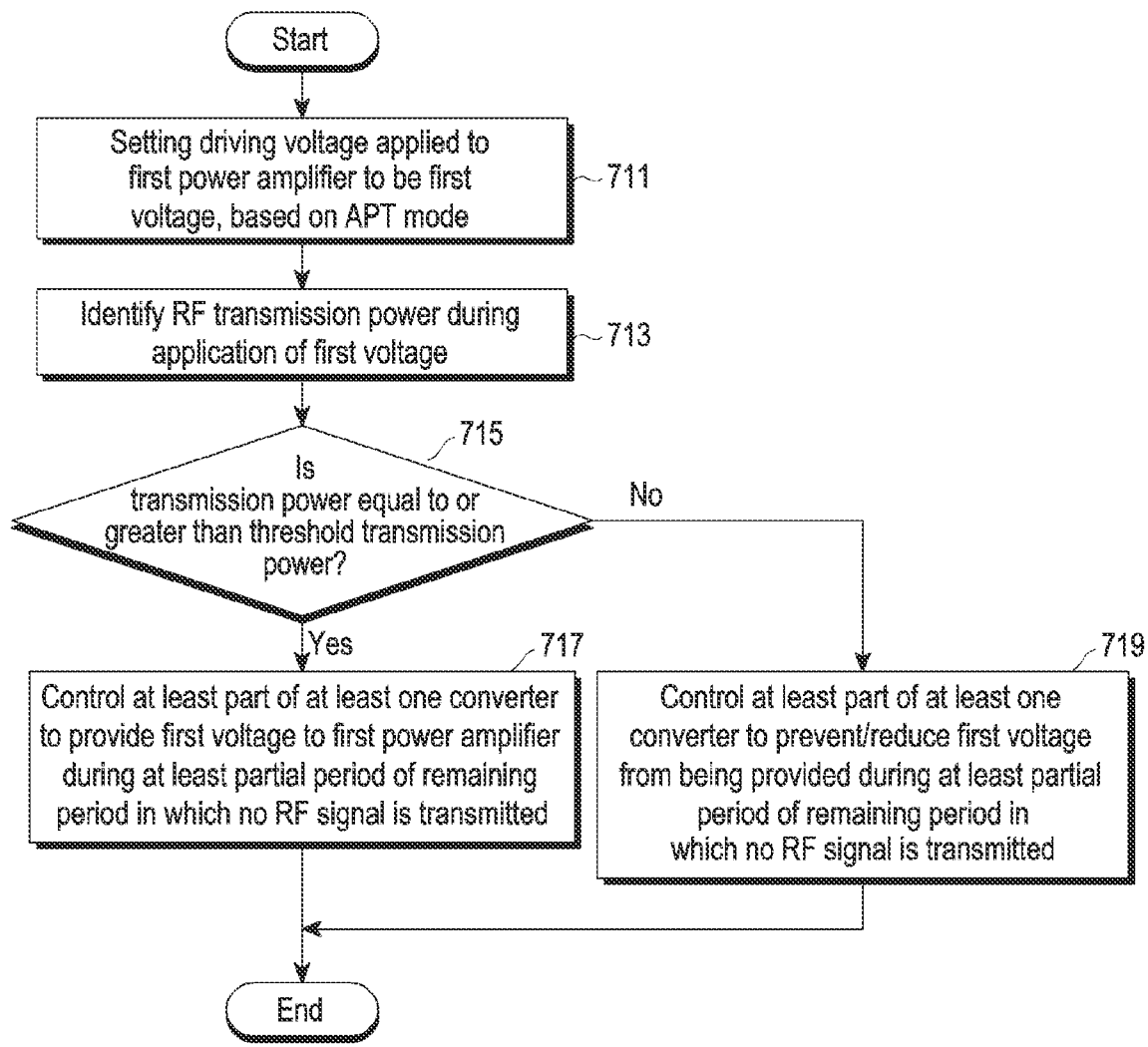
FIG. 7B is a flowchart illustrating a method for operating an electronic device according to various embodiments.

FIG. 7B is a flowchart illustrating a method for operating an electronic device according to various embodiments.

According to various embodiments, the electronic device 101 (e.g., at least one of the processor 120, the first communication processor 212, the second communication processor 214, the integrated communication processor 260, or the communication processor 310) may set a driving voltage applied to a first power amplifier to be a first voltage, based on an APT mode, in operation 711. The electronic device 101 may identify the transmission power of an RF signal in operation 713. In one example, the electronic device 101 may identify the transmission power (e.g., FBRX power) of an RF signal measured through a coupler for the corresponding RF path. The electronic device 101 may identify the transmission power of the RF signal, based on at least one of transmission power for each physical channel configured by a network, the maximum output power (e.g., PCMAX) according to the power class of the electronic device 101, or output power configured based on an event (e.g., SAR event or over temperature event), which is identified by the electronic device 101. In operation 715, the electronic device 101 may determine whether the transmission power is equal to or greater than threshold transmission power. The electronic device 101 may determine that the event has been detected, based on the determination that the transmission power is equal to or greater than the threshold transmission power. In one example, the electronic device 101 may store one threshold transmission power (e.g., 19.4 dBm). In another example, the threshold transmission power may be configured differently for each RAT and/or operating frequency band, and the threshold transmission power may be variable.

According to various embodiments, the electronic device 101 may be configured to, based on the transmission power being equal to or greater than the threshold transmission power ("Yes" in operation 715), control at least part of the at least one converter to provide a first voltage to a first power amplifier during at least a partial period of a remaining period in which no RF signal is transmitted, in operation 717. As described above, when the transmission power is equal to or greater than the threshold transmission power, the electronic device 101 may be configured to control at least part of the at least one converter to provide the first voltage to the first power amplifier during the entire period of time, or to control at least part of the at least one converter to provide the first voltage to the first power amplifier during a partial period of a non-transmission period. Based on the transmission power being less than the threshold transmission power ("No" in 715), the electronic device 101 may be configured to control at least part of the at least one converter to prevent and/or reduce the first voltage from being provided during at least partial period of the remaining period in which no RF signal is transmitted, in operation 719. The electronic device 101 may be configured to control at least part of the at least one converter to provide the first voltage to the first power amplifier while the RF signal is being transmitted. When the transmission power is relatively large, the driving voltage applied to the capacitor may also be relatively large, and thus a larger vibration may be caused. Accordingly, in the electronic device 101, when the transmission power is equal to or greater than the threshold transmission power, audible noise is highly likely to be generated, and thus the first voltage may be applied during at least a portion of a non-transmission period. On the other hand, when the transmission power is less than the threshold transmission power, the possibility of generating audible noise is low (or the possibility that a user hears the audible noise is low), and thus the application of the first voltage may not be performed during the non-transmission period so as to reduce current consumption.

Meanwhile, although not shown, the electronic device 101 may determine, as the occurrence of event, the satisfaction of various conditions described above in addition to the magnitude of the driving voltage and the magnitude of the transmission power. For example, the electronic device 101 may be configured to, based on at least one of proximity detection by a proximity sensor, performance of a VoIP service (e.g., VoLTE, VoNR, and VoWiFi), execution of an application for sound output (e.g., a phone application), or obtaining of information indicating a speaker and/or an operation of the speaker, control at least part of the at least one converter to provide the first voltage to the first power amplifier during the entire period of time, or control at least part of the at least one converter to provide the first voltage to the first power amplifier during a partial period of a non-transmission period. In case that the above-described event is not detected, although audible noise occurs, a user is less likely to hear, and thus, in the electronic device 101, application of the first voltage may not be performed during the non-transmission period so as to reduce current consumption. The electronic device 101 may determine whether to apply the first voltage during at least a partial period of the non-transmission period according to whether or not at least one of the event of FIG. 7A, the event of FIG. 7B, and various events described above has been detected.

Figure 8A:
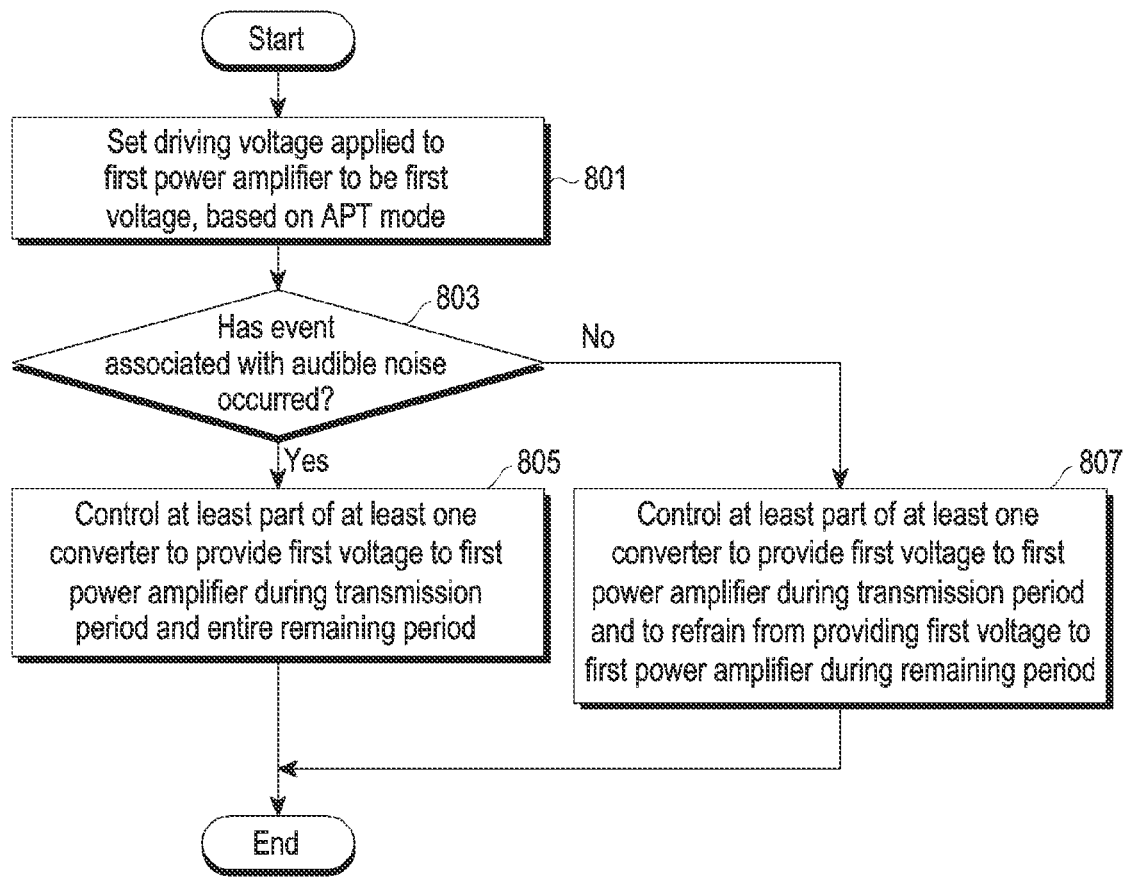
FIG. 8A is a flowchart illustrating a method for operating an electronic device according to various embodiments.

FIG. 8A is a flowchart illustrating a method for operating an electronic device according to various embodiments.

According to various embodiments, the electronic device 101 (e.g., at least one of the processor 120, the first communication processor 212, the second communication processor 214, the integrated communication processor 260, or the communication processor 310) may set a driving voltage applied to a first power amplifier to be a first voltage, based on an APT mode, in operation 801. The electronic device 101 may identify whether an event associated with audible noise has occurred, in operation 803. The event associated with audible noise may be at least one of a condition associated with the driving voltage described with reference to FIG. 7A, a condition associated with the transmission power described with reference to FIG. 7B, and various conditions related to the operation of the speaker, and there is no limitation thereto. When an event associated with audible noise has occurred ("Yes" in operation 803), the electronic device 101 may be configured to control at least part of the at least one converter to provide the first voltage to the first power amplifier during a transmission period and the entirety of the remaining period, in operation 805. Accordingly, the driving voltage may be applied to a power amplifier and a capacitor even while no RF signal is being transmitted. The electronic device 101 may continuously monitor whether an event occurs or ends. Before the event ends, the electronic device 101 may continue to apply the driving voltage. When it is identified that the event has ended, the electronic device 101 may be configured to control at least part of the at least one converter to provide the first voltage to the first power amplifier during the transmission period, and not to provide the first voltage to the first power amplifier during the remaining period. When an event associated with audible noise does not occur ("No" in operation 803), the electronic device 101 may be configured to control at least part of the at least one converter to provide the first voltage to the first power amplifier during the transmission period, and to refrain from providing the first voltage to the first power amplifier during the remaining period, in operation 807. Since the driving voltage is applied to the capacitor during the entire period of time, there is no increase or decrease in voltage and thus audible noise may not occur.

Figure 8B:
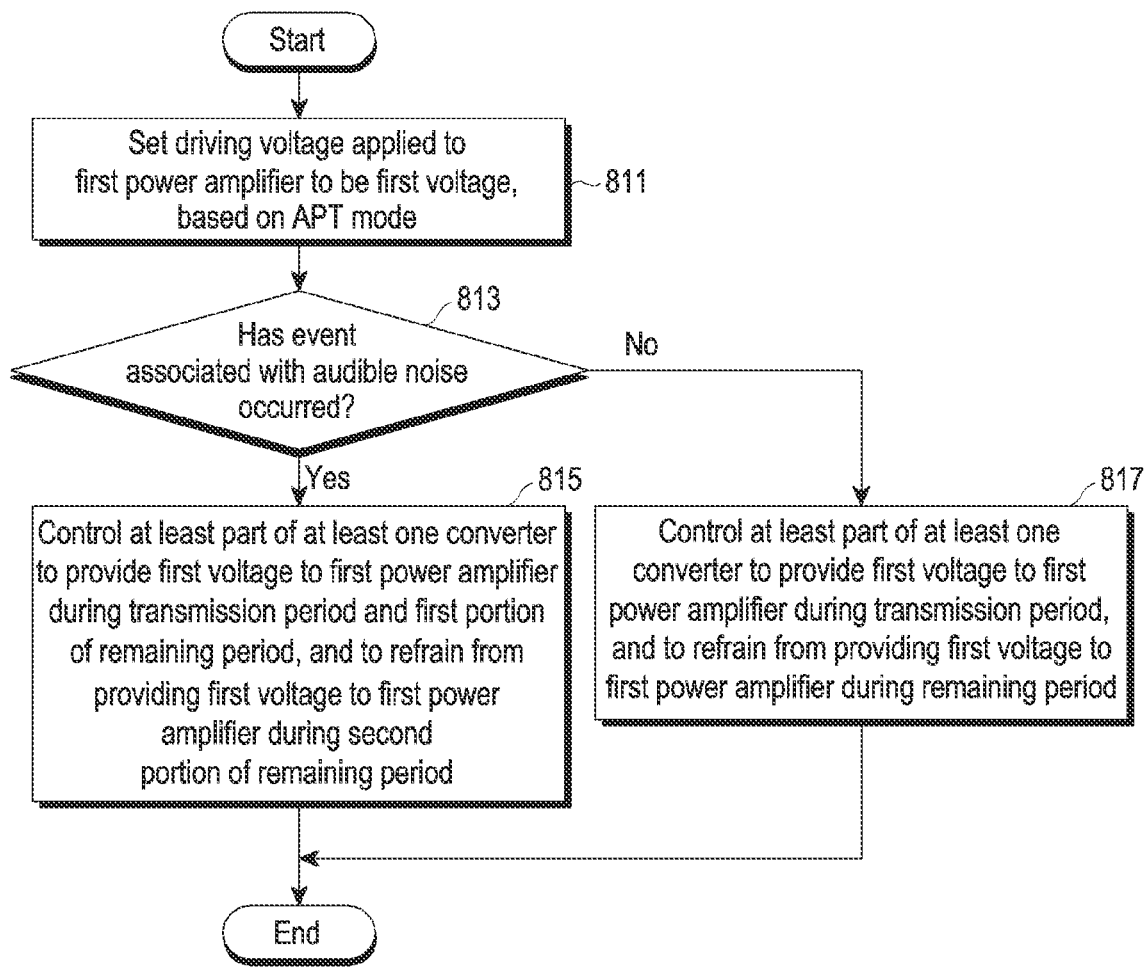
FIG. 8B is a flowchart illustrating a method for operating an electronic device according to various embodiments.

FIG. 8B is a flowchart illustrating a method for operating an electronic device according to various embodiments.

According to various embodiments, the electronic device 101 (e.g., at least one of the processor 120, the first communication processor 212, the second communication processor 214, the integrated communication processor 260, or the communication processor 310) may set a driving voltage applied to a first power amplifier to be a first voltage, based on an APT mode, in operation 811. The electronic device 101 may identify whether an event associated with audible noise has occurred, in operation 813. When the event associated with audible noise has occurred ("Yes" in operation 813), the electronic device 101 may be configured to control at least part of the at least one converter to provide the first voltage to the first power amplifier during a transmission period and a first portion of the remaining period, and not to provide the first voltage to the first power amplifier during a second portion of the remaining period, in operation 815. In one example, the electronic device 101 may be configured to control at least part of the at least one converter to provide the first voltage to the first power amplifier during downlink subframes located between uplink subframes, and refrain from providing the first voltage to the first power amplifier during the remaining downlink subframes, which will be described with reference to FIGS. 11 and 12. The electronic device 101 may continuously monitor whether an event occurs or ends. Before the event ends, the electronic device 101 may continue to apply the driving voltage. When it is identified that the event has ended, the electronic device 101 may be configured to control at least part of the at least one converter to provide the first voltage to the first power amplifier during the transmission period, and not to provide the first voltage to the first power amplifier during the remaining period. Meanwhile, when an event associated with audible noise does not occur ("No" in operation 813), the electronic device 101 may be configured to control at least part of the at least one converter to provide the first voltage to the first power amplifier during the transmission period, and refrain from providing the first voltage to the first power amplifier during the remaining period, in operation 817. As described above, when the event associated with audible noise has occurred, the electronic device 101 may perform application of the driving voltage during a partial period of the non-transmission period rather than all periods of time. Accordingly, the driving voltage may not be applied during the remaining partial period of the non-transmission period, thereby reducing current consumption.

According to various embodiments, the electronic device 101 may determine whether to apply a driving voltage during the entire period of time as shown in FIG. 8A, or whether to apply the driving voltage during a partial period of a non-transmission period and not to apply the driving voltage during the remaining period of the non-transmission period as shown in FIG. 8B, according to the current state of the electronic device 101. For example, when the remaining battery amount is equal to or greater than a threshold remaining amount, the electronic device 101 may apply the driving voltage during the entire period of time as illustrated in FIG. 8A in response to detection of an audible noise event. When the remaining battery amount is relatively sufficient, it may be configured such that audible noise is not to be generated even when the consumption current increases. When the remaining battery amount is less than the threshold remaining amount, the electronic device 101 may apply a driving voltage during a partial period of the non-transmission period as shown in FIG. 8B, and may not apply the driving voltage during the remaining period of the non-transmission period, in response to detection of the audible noise event. Here, although audible noise is generated, current consumption can be reduced. In another example, when the measured temperature in at least one point of the electronic device 101 is equal to or lower than a threshold temperature, the electronic device 101 may apply the driving voltage during the entire period of time, in response to the detection of the audible noise event, as shown in FIG. 8A. When the temperature is equal to or higher than the threshold temperature, the electronic device 101 may apply the driving voltage during a partial period of the non-transmission period and may not apply the driving voltage during the remaining period of the non-transmission period, in response to the detection of the audible noise event, as shown in FIG. 8B. The continuous voltage application to the capacitor may cause a temperature rise, and when the temperature is relatively low, the electronic device 101 may apply the driving voltage during the entire period of time.

Figure 9:
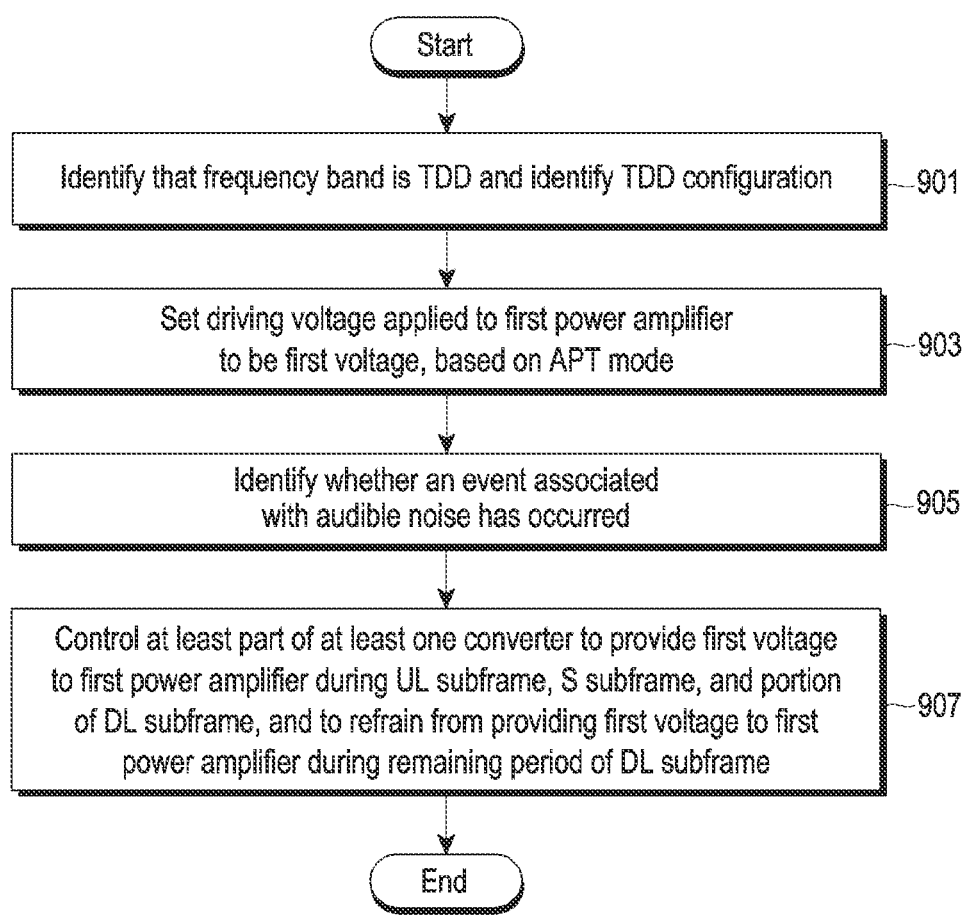
FIG. 9 is a flowchart illustrating a method for operating an electronic device according to various embodiments.
Figure 10:
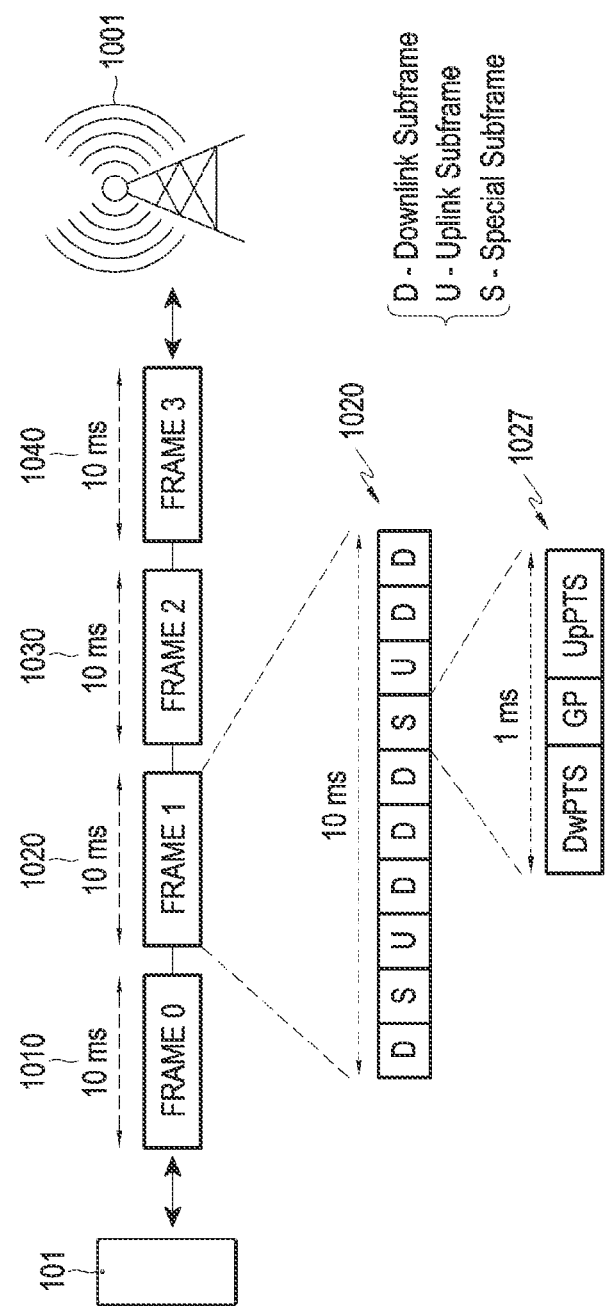
FIG. 10 illustrates a TDD configuration according to various embodiments.

FIG. 9 is a flowchart illustrating a method for operating an electronic device according to various embodiments. An embodiment of FIG. 9 will be described with reference to FIG. 10. FIG. 10 illustrates TDD configurations according to various embodiments.

According to various embodiments, the electronic device 101 (e.g., at least one of the processor 120, the first communication processor 212, the second communication processor 214, the integrated communication processor 260, or the communication processor 310) may identify that a frequency band is TDD and identify a configuration of the time division duplex (TDD), in operation 901. Whether a specific frequency band is either TDD or frequency division duplex (FDD) may be defined according to a standard, but there is no limitation thereto. The electronic device 101 may identify a TDD configuration, for example, based on a radio resource control (RRC) reconfiguration message (e.g., an RRC connection reconfiguration message of 3GPP TS 36.331 or an RRC reconfiguration message of TS 38.331) received from a network. For example, the electronic device 101 may identify the TTD configuration at least based on a subframe assignment, a pattern, a periodicity in which the configuration persists (dl-ul-transmissionperiodicity), the number of downlink slots (nrofdownlinkslots), the number of downlink symbols (nrofdownlinksymbols), the number of uplink slots (nrofuplinkslots), or the number of uplink symbols (nrofuplinksymblos), but there is no limitation to the method of identifying the TDD configuration. For example, referring to FIG. 10, a network 1001 may provide subframe allocation information for each of at least one frame 1010, 1020, 1030, and 1040 configured for the electronic device 101 to the electronic device 101. For example, subframe allocation information of a second frame 1020 may be D, S, U, D, D, D, S, U, D, D. The electronic device 101 may transmit an RF signal in an uplink subframe and may receive an RF signal in a downlink subframe. A special subframe 1027 may include a downlink pilot time slot (DwPTS) used for RF signal reception, a guard period (GP) for a time interval, and an uplink pilot time slot (UpPTS) used for RF signal transmission. The electronic device 101 may provide a driving voltage to a power amplifier in order to perform transmission of the RF signal during an uplink subframe and a special subframe when an event associated with audible noise does not occur, and may not provide the driving voltage to the power amplifier because transmission of the RF signal is not performed during a downlink subframe.

According to various embodiments, the electronic device 101 may set a driving voltage applied to a first power amplifier to be a first voltage, based on an APT mode, in operation 903. The electronic device 101 may identify whether an event associated with audible noise has occurred, in operation 905. The event associated with audible noise may be at least one of a condition associated with the driving voltage described with reference to FIG. 7A, a condition associated with the transmission power described with reference to FIG. 7B, and various conditions related to operation of the speaker, and there is no limitation thereto. The electronic device 101 may be configured to control at least part of the at least one converter to provide the first voltage to the first power amplifier during an uplink subframe, a special subframe, and a portion of a downlink subframe, and not to provide the first voltage to the first power amplifier during the remaining period of the downlink subframe, in operation 907. When the event associated with audible noise has occurred, the electronic device 101 may be configured to control at least part of the at least one converter to provide the driving voltage to the power amplifier during the entire downlink subframe or a portion of the downlink subframe.

Figure 11:
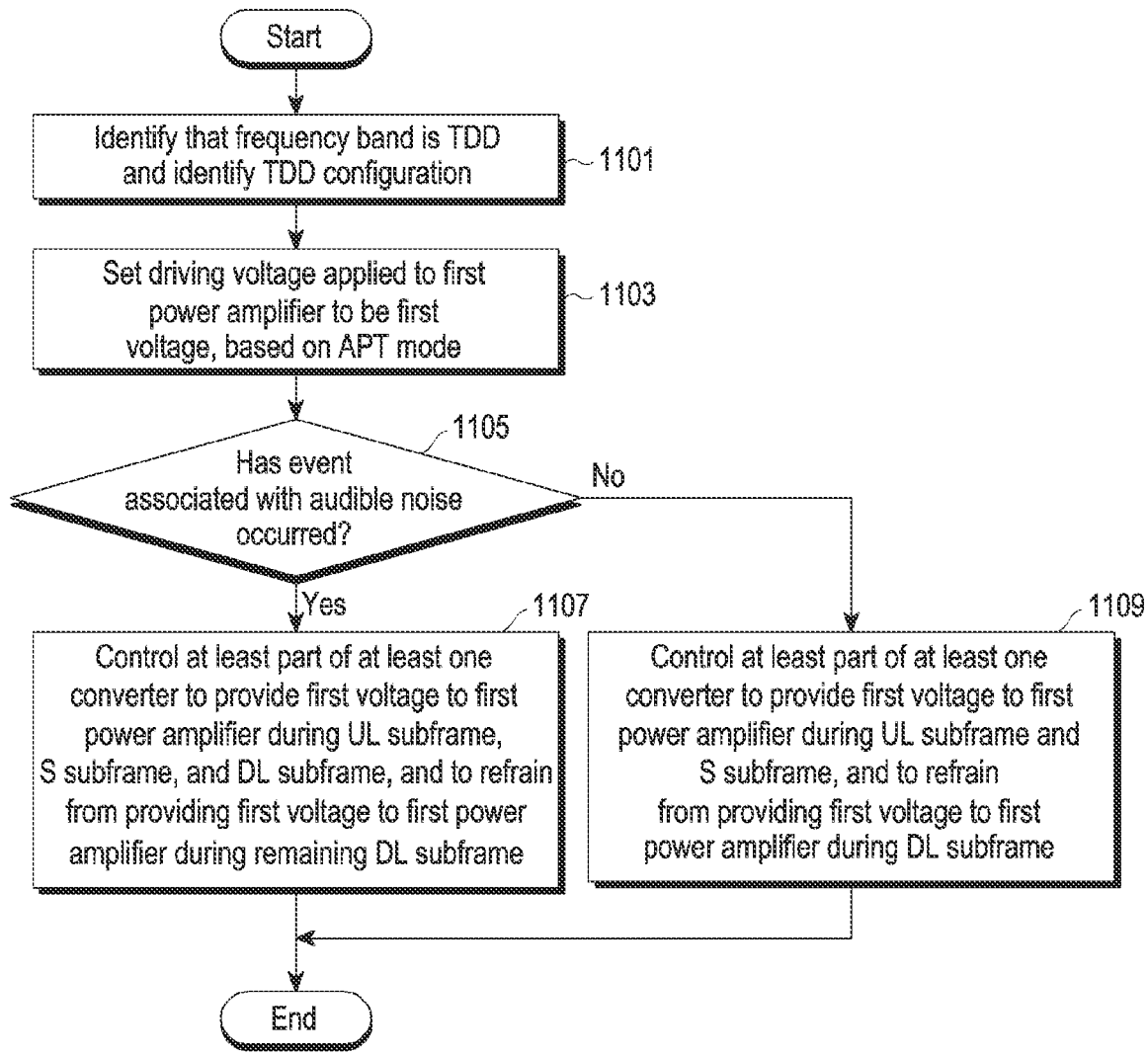
FIG. 11 is a flowchart illustrating a method for operating an electronic device according to various embodiments.

FIG. 11 is a flowchart illustrating a method for operating an electronic device according to various embodiments. An embodiment of FIG. 11 will be described with reference to FIG. 12. FIG. 12 illustrates TDD configurations according to various embodiments.

According to various embodiments, the electronic device 101 (e.g., at least one of the processor 120, the first communication processor 212, the second communication processor 214, the integrated communication processor 260, or the communication processor 310) may identify that a frequency band is TDD and identify a configuration of the TDD, in operation 1101. Whether a specific frequency band is either TDD or FDD may be defined according to a standard, but there is no limitation thereto. The electronic device 101 may identify a TDD configuration, for example, based on an RRC reconfiguration message received from a network. The electronic device 101 may set a driving voltage applied to a first power amplifier to be a first voltage, based on an APT mode, in operation 1103. The electronic device 101 may identify whether an event associated with audible noise has occurred, in operation 1105.

According to various embodiments, when it is identified that an event associated with audible noise has occurred ("Yes" in operation 1105), the electronic device 101 may be configured to control at least part of the at least one converter to provide a first voltage to a first power amplifier during an uplink subframe, a special subframe, and a downlink subframe located between the uplink subframes, and to refrain from providing the first voltage to the first power amplifier during the remaining downlink subframes, in operation 1107. When there is no identification of the occurrence of the event associated with audible noise ("No" in operation 1105), the electronic device 101 may be configured to control at least part of the at least one converter to provide the first voltage to the first power amplifier during an uplink subframe and a special subframe, and to refrain from providing the first voltage to the first power amplifier during a downlink subframe, in operation 1109. For example, referring to FIG. 12, the electronic device 101 may configure the first uplink-downlink configuration to be "D, S, U, U, U, D, S, U, U, U". In this case, the electronic device 101 may control the converter to provide a driving voltage to a power amplifier during a downlink subframe 1201 located between the uplink subframes. During the remaining downlink subframes other than the downlink subframe 1201, the electronic device 101 may control at least part of at least one converter so as not to provide the first voltage to the first power amplifier. In one frame, uplink subframe groups may be identified, and the uplink subframe groups may include a first uplink subframe group including a second subframe, a third subframe, and a fourth subframe, and a second uplink subframe group including a seventh subframe, an eighth subframe, and a ninth subframe, based on the first frame for example. Here, a downlink subframe located between uplink subframes may refer to a downlink subframe located between uplink subframe groups. For example, a downlink subframe, which is located between the fourth subframe that is the last subframe of the first uplink subframe group and the seventh subframe that is the first subframe of the second uplink subframe group, may be a downlink subframe located between uplink subframes. With regard to the first frame, the number of subframes to which a driving voltage is applied may be one even though it is a downlink subframe, and this is called "the number of changed subframes" for convenience. Based on the first frame, when an audible noise-associated event does not occur, discharge of the capacitor may occur twice (for example, a time point of change from the fourth subframe to the fifth subframe, and a time point of change from the ninth subframe to the next frame), and charge of the capacitor may occur twice (e.g., a time point of change from the 0th subframe to the first subframe, and a time point of change from the fifth subframe to the 6th subframe). Meanwhile, it is assumed that the driving voltage is applied to the capacitor during the downlink subframe 1201 according to the occurrence of an audible noise-associated event. In this case, based on the first frame, discharge of the capacitor may occur once (a time point of change from the ninth subframe to the next frame), and charge of the capacitor may occur once (for example, a time point of change from the 0th subframe to the first subframe). That is, according to the application of the driving voltage during some downlink subframes, the number of times of charging and discharging the capacitor may be reduced, and thus audible noise may be reduced.

For example, referring to FIG. 12, the electronic device 101 may configure "D, S, U, U, D, D, S, U, U, D" to be the second uplink-downlink configuration. In this case, the electronic device 101 may control the converter to provide the driving voltage to the power amplifier during downlink subframes 1211 and 1212 located between the uplink subframes. During the remaining downlink subframes other than the downlink subframes 1211 and 1212, the electronic device 101 may control at least part of at least one converter so as not to provide the first voltage to the first power amplifier. With regard to a second frame, the number of changed subframes may be two. Based on the second frame, when an audible noise-associated event does not occur, discharge of the capacitor may occur twice (for example, a time point of change from the third subframe to the fourth subframe, and a time point of change from the eighth subframe to the ninth subframe), and charge of the capacitor may occur twice (e.g., a time point of change from the 0th subframe to the first subframe, and a time point of change from the fifth subframe to the sixth subframe). Meanwhile, it is assumed that the driving voltage is applied to the capacitor during the downlink subframes 1211 and 1212 according to the occurrence of the audible noise-associated event. In this case, based on the second frame, discharge of the capacitor may occur once (a time point of change from the eighth subframe to the ninth subframe), and charge of the capacitor may occur once (for example, a time point of change from the 0th subframe to the first subframe). That is, according to the application of the driving voltage during some downlink subframes, the number of times of charging and discharging the capacitor may be reduced, and thus audible noise may be reduced.

For example, referring to FIG. 12, the electronic device 101 may configure the third uplink-downlink configuration to be "D, S, U, D, D, D, S, U, D, D". In this case, the electronic device 101 may control the converter to provide the driving voltage to the power amplifier during downlink subframes 1213, 1214, and 1215 located between the uplink subframes. During the remaining downlink subframes other than the downlink subframes 1213, 1214, and 1215, the electronic device 101 may control at least part of at least one converter so as not to provide the first voltage to the first power amplifier. With regard to a third frame, the number of changed subframes may be three. Based on the third frame, when an audible noise-associated event does not occur, discharge of the capacitor may occur twice (for example, a time point of change from the second subframe to the third subframe, and a time point of change from the seventh subframe to the eighth subframe), and charge of the capacitor may occur twice (e.g., a time point of change from the 0th subframe to the first subframe, and a time point of change from the fifth subframe to the sixth subframe). It is assumed that the driving voltage is applied to the capacitor during the downlink subframes 1213, 1214, and 1215 according to the occurrence of the audible noise-associated event. In this case, based on the third frame, discharge of the capacitor may occur once (a time point of change from the seventh subframe to the eighth subframe), and charge of the capacitor may occur once (for example, a time point of change from the 0th subframe to the first subframe). That is, according to the application of the driving voltage during some downlink subframes, the number of times of charging and discharging the capacitor may be reduced, and thus audible noise may be reduced.

For example, referring to FIG. 12, the electronic device 101 may configure the seventh uplink-downlink configuration to be "D, S, U, U, U, D, S, U, U, D". In this case, the electronic device 101 may control the converter to provide the driving voltage to the power amplifier during a downlink subframe 1221 located between the uplink subframes. During the remaining downlink subframes other than the downlink subframe 1221, the electronic device 101 may control at least part of at least one converter so as not to provide the first voltage to the first power amplifier. With regard to a seventh frame, the number of changed subframes may be one. Based on the seventh frame, when an audible noise-associated event does not occur, discharge of the capacitor may occur twice (for example, a time point of change from the fourth subframe to the fifth subframe, and a time point of change from the eighth subframe to the ninth subframe), and charge of the capacitor may occur twice (e.g., a time point of change from the 0th subframe to the first subframe, and a time point of change from the fifth subframe to the sixth subframe). It is assumed that the driving voltage is applied to the capacitor during the downlink subframe 1221 according to the occurrence of an audible noise-associated event. In this case, based on the seventh frame, discharge of the capacitor may occur once (a time point of change from the eighth subframe to the ninth subframe), and charge of the capacitor may occur once (for example, a time point of change from the 0th subframe to the first subframe). That is, according to the application of the driving voltage during some downlink subframes, the number of times of charging and discharging the capacitor may be reduced, and thus audible noise may be reduced. On the other hand, with regard to "D, S, U, U, U, D, D, D, D, D" of the fourth uplink-downlink configuration, "D, S, U, U, D, D, D, D, D, D" of the fifth uplink-downlink configuration, and "D, S, U, D, D, D, D, D, D, D" of the sixth uplink-downlink configuration, a downlink subframe located between the uplink subframes may not exist. In the fourth, fifth, and sixth uplink-downlink configurations, the electronic device 101 may not apply the driving voltage to the capacitor during downlink subframes even when the audible noise-associated event occurs.

However, in an embodiment, when the audible noise-associated event has occurred, the electronic device 101 may be configured to apply a driving voltage during a downlink subframe between uplink subframes during the 0th, the first, the second, the third, and the seventh uplink-downlink configuration, and to apply the driving voltage during a downlink subframe between all subframes during the fourth, the fifth, and the sixth uplink-downlink configuration. In addition, in an embodiment, the electronic device 101 may apply the driving voltage to the capacitor during a downlink subframe outside the uplink subframe, other than a downlink subframe between the uplink subframes. The downlink subframe outside the uplink subframe may refer to, for example, the remaining downlink subframes other than the downlink subframe between uplink subframes. For example, based on the first frame, the electronic device 101 may be implemented to apply a driving voltage to the capacitor during the downlink subframe of the 0th subframe, based on the detection of the audible noise-associated event, and not to apply the driving voltage to the capacitor during the downlink subframe of the fifth subframe.

Figure 13:
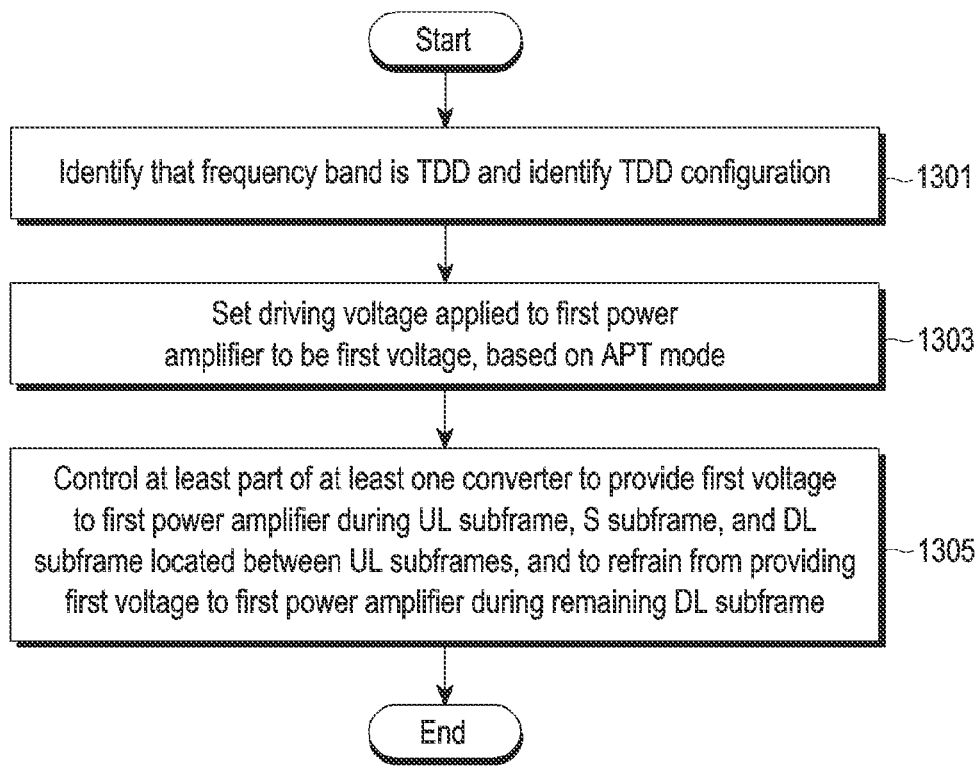
FIG. 13 is a flowchart illustrating a method for operating an electronic device according to various embodiments.

FIG. 13 is a flowchart illustrating a method for operating an electronic device according to various embodiments.

According to various embodiments, the electronic device 101 (e.g., at least one of the processor 120, the first communication processor 212, the second communication processor 214, the integrated communication processor 260, or the communication processor 310) may identify that a frequency band is TDD and identify a configuration of the TDD, in operation 1301. Whether a specific frequency band is either TDD or FDD may be defined according to a standard, but there is no limitation thereto. The electronic device 101 may identify a TDD configuration, for example, based on an RRC reconfiguration message received from a network. The electronic device 101 may set a driving voltage applied to a first power amplifier to be a first voltage, based on an APT mode, in operation 1303. The electronic device 101 may control at least part of the converter to provide the first voltage to the first power amplifier during an uplink subframe, a special subframe, and a downlink subframe located between uplink subframes, and to refrain from providing the first voltage to the first power amplifier during the remaining downlink subframes, in operation 1305. In an embodiment, the electronic device 101 may control at least part of the converter to provide the first voltage to the first power amplifier during an uplink subframe, a special subframe, and a downlink subframe located outside the uplink subframe, and not to provide the first voltage to the first power amplifier during the remaining downlink subframes. In an embodiment, the electronic device 101 may determine a downlink subframe in which application of the driving voltage should be maintained, based on the uplink-downlink configuration.

Figure 14:
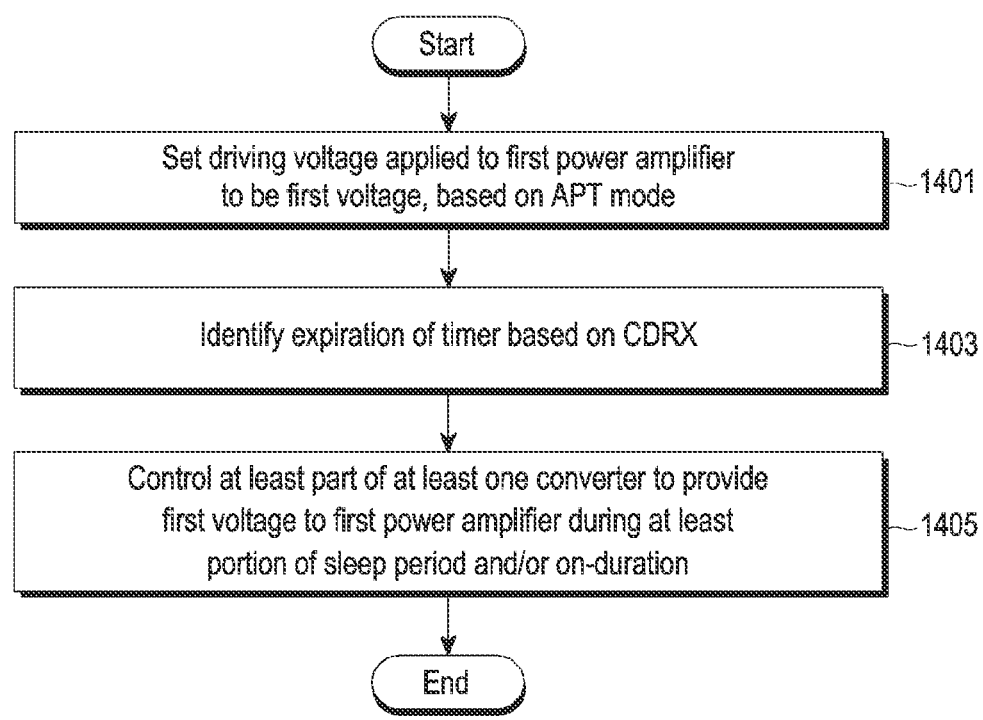
FIG. 14 is a flowchart illustrating a method for operating an electronic device according to various embodiments.
Figure 15:
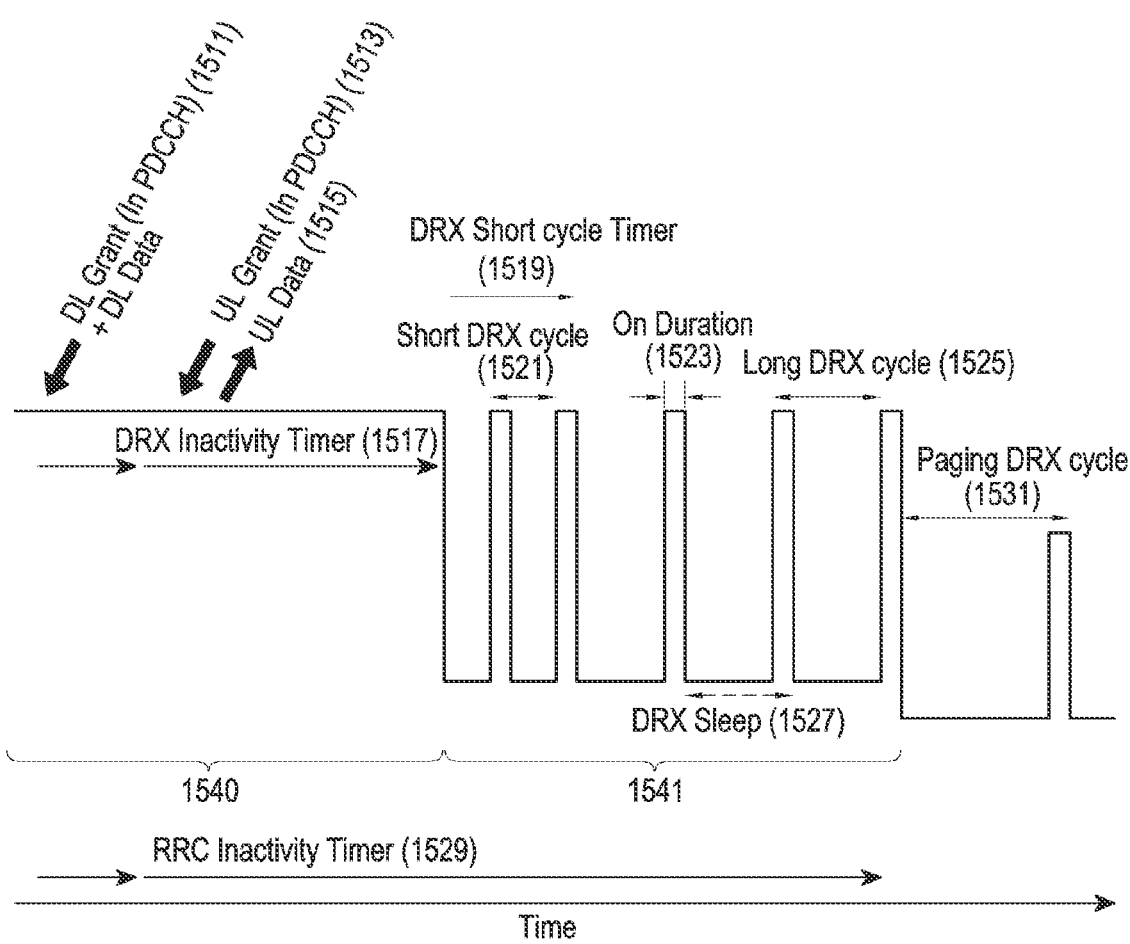
FIG. 15 illustrates a CDRX configuration according to various embodiments.

FIG. 14 is a flowchart illustrating a method for operating an electronic device according to various embodiments. An embodiment of FIG. 14 will be described with reference to FIG. 15. FIG. 15 illustrates CDRX configurations according to various embodiments.

According to various embodiments, the electronic device 101 (e.g., at least one of the processor 120, the first communication processor 212, the second communication processor 214, the integrated communication processor 260, or the communication processor 310) may set a driving voltage applied to a first power amplifier to be a first voltage, based on an APT mode, in operation 1401. The electronic device 101 may identify expiration of a timer based on continuous mode discontinuous reception (CDRX), in operation 1403. Discontinuous reception (DRX) may be used in an RRC IDLE state, an RRC INACTIVE state, and an RRC CONNECTED state, and CDRX may refer to a DRX mode in the RRC CONNECTED state. The CDRX may operate in association with a monitoring period related to the physical downlink control channel (PDCCH). The DRX mode in the RRC IDLE state may be referred to as IDRX, and IDRX may operate in association with a monitoring period related to a paging signal. Referring to FIG. 15, the electronic device may enter a DRX mode 1541 based on expiration of the timer. The electronic device 101 may receive a DL grant and DL data in a PDCCH in operation 1511. The electronic device 101 may restart the timer. Before the timer expires, the electronic device 101 may, for example, identify a UL grant in the PDCCH in operation 1513, and may transmit UL data in operation 1515. The electronic device 101 may restart a timer 1517 (e.g., a DRX inactivity timer). Before the timer expires, the electronic device 101 may constantly perform PDCCH monitoring, for example, for all subframes. An active state 1540 is a state before the timer expires, and may denote a state in which the timer is running. Alternatively, the active state 1540 may denote a state out of the DRX mode. The active state may denote a state in which PDCCH monitoring is performed for all subframes in a case of E-UTRA and PDCCH monitoring is performed for subframes designated by a network in a case of NR. According to various embodiments, when the timer has expired, the electronic device 101 may enter the DRX mode 1541. In the DRX mode, the electronic device 101 may perform PDCCH monitoring in a period of DRX cycle 1521. For example, the electronic device 101 may not perform PDCCH monitoring for some subframes. The monitoring may be performed for on-duration 1523. During a duration other than the on-duration 1523 (e.g., the battery saving period), an entity (e.g., CP) having entered the DRX mode of the electronic device 101 may be in a sleep state 1527, thereby saving power consumption. The DRX mode 1541 may be in a state of monitoring the PDCCH for a predetermined duration (e.g., on-duration) in a predetermined period (e.g., DRX cycle). The DRX mode 1541 may refer to a state, in which the PDDCH monitoring for a smaller number of subframes compared to that of the active state 1540 is performed, according to the timer expiration. According to various embodiments, the electronic device 101 may start a DRX short cycle timer 1519 while entering the DRX mode 1541. When the DRX short cycle timer 1519 has expired, the electronic device 101 may monitor the PDCCH in a period of long DRX cycle 1525. When the RRC inactivity timer 1529 has expired, the electronic device 101 may enter an RRC idle state, and may monitor the PDCCH in a period of paging DRX cycle 1531. In various embodiments, when entering the DRX mode, the electronic device 101 may monitor the PDCCH in a period of single cycle (e.g., a long DRX cycle).

According to various embodiments, in operation 1405, the electronic device 101 may control at least part of at least one converter such that a first voltage is provided to a first power amplifier during at least a portion of a CDRX sleep period and/or on-duration. Since no RF signal is transmitted during the CDRX mode, the capacitor may be in a discharged state. On the other hand, when waking up from the CDRX mode, an RF signal may be transmitted, and in this case, the capacitor may be charged. Upon entering the CDRX mode and waking up, charge and discharge of the capacitor may occur. The electronic device 101 may control at least part of the at least one converter such that the first voltage is provided to the first power amplifier during at least a portion of the CDRX sleep period and/or on-duration, and thus the generation of audible noise can be reduced.

According to various embodiments, an electronic device (e.g., the electronic device 101) may include: at least one processor (e.g., at least one of the first communication processor 212, the second communication processor 214, the integrated communication processor 260, or the communication processor 310) configured to output at least one baseband signal, a radio frequency integrated circuit (RFIC) (e.g., at least one of the first RFIC 222, the second RFIC 224, the third RFIC 226, the fourth RFIC 228, or the RFIC 320) configured to output at least one RF signal generated based on the at least one baseband signal, at least one power amplifier (e.g., at least one of the power amplifier 330, the power amplifier 330a, the power amplifier 330b, or the power amplifier 330c) configured to amplify the at least one RF signal and to output the amplified RF signal to at least one antenna, and at least one converter (e.g., at least one of the converter 350 and the first converter 350a) comprising circuitry configured to provide a driving voltage for amplifying the at least one RF signal to the power amplifier, wherein at least one capacitor (e.g., at least one of the capacitor 361 of FIG. 3A or the capacitor 361a of FIG. 3B) is connected between at least part of the at least one converter and the at least one power amplifier, and the at least one communication processor is configured to: set a driving voltage applied to a first power amplifier for amplifying a first RF signal provided from the RFIC among the at least one power amplifier, to be a first voltage, based on an average power tracking (APT) mode, control at least part of the at least one converter to provide a first voltage, set based on the APT mode, to the first power amplifier during a transmission period of the first RF signal, and control at least part of the at least one converter to provide the first voltage to the first power amplifier during at least partial period of a remaining period in which no RF signal is transmitted based on the occurrence of an event associated with audible noise, wherein the first voltage is applied to the at least one capacitor during the transmission period, and the first voltage is applied to the at least one capacitor during the at least partial period of the remaining period.

According to various embodiments, the at least one processor may be further configured to: identify that the event has occurred, based on the first voltage being equal to or greater than a threshold voltage.

According to various embodiments, the at least one processor may be further configured to identify the transmission power of the first RF signal, and identify that the event has occurred, based on the transmission power being equal to or greater than a threshold transmission power.

According to various embodiments, the at least one processor may be further configured to: identify that the event has occurred based on at least one of proximity detection by a proximity sensor of the electronic device, performance of a VoIP service, execution of an application for sound output, or obtaining of information indicating a speaker and/or an operation of the speaker.

According to various embodiments, the at least one processor may be configured, as at least a part of controlling at least part of the at least one converter to provide the first voltage to the first power amplifier during the at least partial period of the remaining period, to control at least part of the at least one converter to provide the first voltage to the first power amplifier during an entirety of the remaining period.

According to various embodiments, the at least one processor may be configured, as at least a part of controlling at least part of the at least one converter to provide the first voltage to the first power amplifier during the at least partial period of the remaining period, to control at least part of the at least one converter to provide the first voltage to the first power amplifier during a first period of the remaining period, and to refrain from providing the first voltage to the first power amplifier during a second period except for the first period of the remaining period.

According to various embodiments, the at least one processor may be further configured to identify the electronic device being configured to transmit the first RF signal based on time division duplex (TDD), and/or uplink-downlink configuration in the TDD.

According to various embodiments, the at least one processor may be configured, as at least a part of controlling at least part of the at least one converter to provide the first voltage to the first power amplifier during the transmission period, to control at least part of the at least one converter to provide the first voltage to the first power amplifier during at least one uplink subframe and at least one special subframe identified based on the uplink-downlink configuration, and as at least a part of controlling at least part of the at least one converter to provide the first voltage to the first power amplifier during a first period of the remaining period, to refrain from providing the first voltage to the first power amplifier during a second period except for the first period of the remaining period, to control at least part of the at least one converter to provide the first voltage to the first power amplifier during a first portion of at least one downlink subframe identified based on the uplink-downlink configuration and to refrain from providing the first voltage to the first power amplifier during a second portion except for the first portion of the at least one downlink subframe.

According to various embodiments, the at least one processor may be configured, as at least a part of controlling at least part of the at least one converter to provide the first voltage to the first power amplifier during the first portion of the at least one downlink subframe and refrain from providing the first voltage to the first power amplifier during the second portion except for the first portion of the at least one downlink subframe, to control at least part of the at least one converter to provide the first voltage to the first power amplifier during the first portion of the at least one downlink subframe, located between a first group of the at least one uplink subframe and a second group spaced apart by at least one subframe from the first group.

According to various embodiments, the at least one processor may be further configured to: control at least part of the at least one converter to provide the first voltage to the first power amplifier during an entirety of the at least one downlink subframe based on the at least one uplink subframe not being divided into a plurality of groups according to the uplink-downlink configuration.

According to various embodiments, the at least one processor may be configured, as at least a part of controlling at least part of the at least one converter to provide the first voltage to the first power amplifier during the first portion of the at least one downlink subframe and to refrain from providing the first voltage to the first power amplifier during the second portion except for the first portion of the at least one downlink subframe, to control at least part of the at least one converter to provide the first voltage to the first power amplifier during the first portion of the at least one downlink subframe except for a downlink subframe, which is located between a first group of the at least one uplink subframe and a second group spaced apart by at least one subframe from the first group.

According to various embodiments, the at least one processor may be configured, as at least a part of controlling at least part of the at least one converter to provide the first voltage to the first power amplifier during at least partial period of the remaining period, based on the occurrence of the event associated with audible noise, to identify timer expiration associated with connected mode discontinuous reception (CDRX) as the event, enter the CDRX state based on the timer expiration, and control at least part of the at least one converter to provide the first voltage to the first power amplifier during at least a portion of a CDRX sleep state and/or on-duration.

According to various embodiments, a method of operating an electronic device may include: setting a driving voltage, which is applied to a first power amplifier for amplifying a first RF signal, to be a first voltage, based on an average power tracking (APT) mode, controlling at least part of at least one converter of the electronic device to provide the first voltage, which is set based on the APT mode, to the first power amplifier during a transmission period of the first RF signal, and controlling at least part of the at least one converter to provide the first voltage to the first power amplifier during at least partial period of a remaining period in which no RF signal is transmitted, based on the occurrence of an event associated with audible noise.

According to various embodiments, the method of operating an electronic device may further include identifying that the event has occurred, based on the first voltage being equal to or greater than a threshold voltage.

According to various embodiments, the method of operating an electronic device may further include identifying a transmission power of the first RF signal, and identifying that the event has occurred, based on the transmission power being equal to or greater than a threshold transmission power.

According to various embodiments, the method of operating an electronic device may further include identifying that the event has occurred, based on at least one of proximity detection by a proximity sensor of the electronic device, performance of a voice over IP (VoIP) service, execution of an application for sound output, or obtaining of information indicating a speaker and/or an operation of the speaker.

According to various embodiments, the controlling of at least part of the at least one converter to provide the first voltage to the first power amplifier during the at least partial period of the remaining period may include: controlling at least part of the at least one converter to provide the first voltage to the first power amplifier during the entirety of the remaining period.

According to various embodiments, the controlling of at least part of the at least one converter to provide the first voltage to the first power amplifier during the at least partial period of the remaining period may include: controlling at least part of the at least one converter to provide the first voltage to the first power amplifier during a first period of the remaining period, and to refrain from providing the first voltage to the first power amplifier during a second period except for the first period of the remaining period.

According to various embodiments, the method of operating the electronic device may further include: identifying the electronic device being configured to transmit the first RF signal based on time division duplex (TDD), and/or uplink-downlink configuration in the TDD, wherein the controlling of at least part of the at least one converter to provide the first voltage to the first power amplifier during the transmission period includes: controlling at least part of the at least one converter to provide the first voltage to the first power amplifier during at least one special subframe and at least one uplink subframe identified based on the uplink-downlink configuration, and wherein the controlling of at least part of the at least one converter to provide the first voltage to the first power amplifier during the first period of the remaining period, and to refrain from providing the first voltage to the first power amplifier during the second period except for the first period of the remaining period includes: controlling at least part of the at least one converter to provide the first voltage to the first power amplifier during a first portion of at least one downlink subframe identified based on the uplink-downlink configuration and to refrain from providing the first voltage to the first power amplifier during a second portion except for the first portion of the at least one downlink subframe.

According to various embodiments, the controlling of at least part of the at least one converter to provide the first voltage to the first power amplifier during the first portion of the at least one downlink subframe and to refrain from providing the first voltage to the first power amplifier during the second portion except for the first portion of the at least one downlink subframe may include: controlling at least part of the at least one converter to provide the first voltage to the first power amplifier during the first portion of the at least one downlink subframe, located between a first group of the at least one uplink subframe and a second group spaced apart by at least one subframe from the first group.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   at least one processor configured to output at least one baseband signal;
   a radio frequency integrated circuit (RFIC) configured to output at least one RF signal generated based on the at least one baseband signal;
   at least one power amplifier configured to amplify the at least one RF signal and output the at least one amplified RF signal to at least one antenna; and
   at least one converter comprising circuitry configured to provide a driving voltage for amplifying the at least one RF signal to the power amplifier, wherein at least one capacitor is connected between at least part of the at least one converter and the at least one power amplifier,
   wherein the at least one processor is configured to:
   set a driving voltage to be applied to a first power amplifier for amplifying a first RF signal provided from the RFIC among the at least one power amplifier, to be a first voltage, based on an average power tracking (APT) mode,
control at least part of the at least one converter to provide a first voltage, set based on the APT mode, to the first power amplifier during a transmission period of the first RF signal, and
control at least part of the at least one converter to provide the first voltage to the first power amplifier during at least partial period of a remaining period in which no RF signal is transmitted, based on occurrence of an event associated with audible noise,
wherein the first voltage is applied to the at least one capacitor during the transmission period, and the first voltage is applied to the at least one capacitor during the at least partial period of the remaining period.

2. The electronic device of claim 1, wherein at least one processor is further configured to identify that the event has occurred based on the first voltage being equal to or greater than a threshold voltage.

3. The electronic device of claim 1, wherein at least one processor is further configured to: identify the transmission power of the first RF signal, and
identify that the event has occurred based on the transmission power being equal to or greater than a threshold transmission power.

4. The electronic device of claim 1, wherein the at least one processor is further configured to: identify that the event has occurred based on at least one of proximity detection by a proximity sensor of the electronic device, performance of a voice over IP (VoIP) service, execution of an application for sound output, or obtaining of information indicating a speaker and/or an operation of the speaker.

5. The electronic device of claim 1, wherein the at least one processor is configured to:
as at least a part of controlling at least part of the at least one converter to provide the first voltage to the first power amplifier during the at least partial period of the remaining period, control at least part of the at least one converter to provide the first voltage to the first power amplifier during an entirety of the remaining period.

6. The electronic device of claim 1, wherein the at least one processor is configured to:
as at least a part of controlling at least part of the at least one converter to provide the first voltage to the first power amplifier during the at least partial period of the remaining period, control at least part of the at least one converter to provide the first voltage to the first power amplifier during a first period of the remaining period, and refrain from providing the first voltage to the first power amplifier during a second period other than the first period of the remaining period.

7. The electronic device of claim 6, wherein the at least one processor is further configured to identify the electronic device being configured to transmit the first RF signal based on time division duplex (TDD), and/or uplink-downlink configuration in the TDD.

8. The electronic device of claim 7, wherein the at least one processor is configured to:
as at least a part of controlling at least part of the at least one converter to provide the first voltage to the first power amplifier during the transmission period, control at least part of the at least one converter to provide the first voltage to the first power amplifier during at least one uplink subframe and at least one special subframe identified based on the uplink-downlink configuration, and
as at least a part of controlling at least part of the at least one converter to provide the first voltage to the first power amplifier during a first period of the remaining period, and to refrain from providing the first voltage to the first power amplifier during a second period other than the first period of the remaining period, control at least part of the at least one converter to provide the first voltage to the first power amplifier during a first portion of at least one downlink subframe identified based on the uplink-downlink configuration and to refrain from providing the first voltage to the first power amplifier during the second portion other than the first portion of the at least one downlink subframe.

9. The electronic device of claim 8, wherein the at least one processor is configured to:
as at least a part of controlling at least part of the at least one converter to provide the first voltage to the first power amplifier during the first portion of at least one downlink subframe identified, and to refrain from providing the first voltage to the first power amplifier during the second portion except for the first portion of the at least one downlink subframe, control at least part of the at least one converter to provide the first voltage to the first power amplifier during the first portion of the at least one downlink subframe located between a first group of the at least one uplink subframe and a second group spaced apart by at least one subframe from the first group.

10. The electronic device of claim 9, wherein the at least one processor is further configured to: control at least part of the at least one converter to provide the first voltage to the first power amplifier during the entirety of the at least one downlink subframe based on the at least one uplink subframe not being divided into a plurality of groups according to the uplink-downlink configuration.

11. The electronic device of claim 8, wherein the at least one processor is configured to:
as at least a part of controlling at least part of the at least one converter to provide the first voltage to the first power amplifier during the first portion of at least one downlink subframe and to refrain from providing the first voltage to the first power amplifier during the second portion other than the first portion of the at least one downlink subframe, control at least part of the at least one converter to provide the first voltage to the first power amplifier during the first portion of the at least one downlink subframe other than a downlink subframe, located between a first group of the at least one uplink subframe and a second group spaced apart by at least one subframe from the first group.

12. The electronic device of claim 1, wherein the at least one processor is configured to:
as at least a part of controlling at least part of the at least one converter to provide the first voltage to the first power amplifier during at least partial period of the remaining period, based on the occurrence of the event associated with audible noise,
identify, as the event, timer expiration associated with continuous mode discontinuous reception (CDRX),
enter the CDRX state based on the timer expiration, and
control at least part of the at least one converter to provide the first voltage to the first power amplifier during at least a portion of a sleep state and/or on-duration of the CDRX state.

13. A method of operating an electronic device, the method comprising:

setting a driving voltage, to be applied to a first power amplifier for amplifying a first RF signal, to be a first voltage, based on an average power tracking (APT) mode;

controlling at least part of at least one converter of the electronic device to provide the first voltage, set based on the APT mode, to the first power amplifier during a transmission period of the first RF signal; and controlling at least part of the at least one converter to provide the first voltage to the first power amplifier during at least partial period of a remaining period in which no RF signal is transmitted, based on occurrence of an event associated with audible noise.

14. The method of claim 13, further comprising identifying that the event has occurred, based on the first voltage being equal to or greater than a threshold voltage.

15. The method of claim 13, further comprising
identifying a transmission power of the first RF signal, and
identifying that the event has occurred, based on the transmission power being equal to or greater than a threshold transmission power.

16. The method of claim 13, further comprising identifying that the event has occurred, based on at least one of proximity detection by a proximity sensor of the electronic device, performance of a voice over IP (VoIP) service, execution of an application for sound output, or obtaining of information indicating a speaker and/or an operation of the speaker.

17. The method of claim 13, wherein the controlling of at least part of the at least one converter to provide the first voltage to the first power amplifier during the at least partial period of the remaining period comprises: controlling at least part of the at least one converter to provide the first voltage to the first power amplifier during an entirety of the remaining period.

18. The method of claim 13, wherein the controlling of at least part of the at least one converter to provide the first voltage to the first power amplifier during the at least partial period of the remaining period comprises:

controlling at least part of the at least one converter to provide the first voltage to the first power amplifier during a first period of the remaining period, and to refrain from providing the first voltage to the first power amplifier during a second period other than the first period of the remaining period.

19. The method of claim 18, further comprising:
identifying the electronic device being configured to transmit the first RF signal based on time division duplex (TDD), and/or uplink-downlink configuration in the TDD, wherein the controlling of at least part of the at least one converter to provide the first voltage to the first power amplifier during the transmission period comprises, controlling at least part of the at least one converter to provide the first voltage to the first power amplifier during at least one special subframe and at least one uplink subframe identified based on the uplink-downlink configuration, and wherein the controlling of at least part of the at least one converter to provide the first voltage to the first power amplifier during the first period of the remaining period, and to refrain from providing the first voltage to the first power amplifier during the second period other than the first period of the remaining period comprises, controlling at least part of the at least one converter to provide the first voltage to the first power amplifier during a first portion of at least one downlink subframe identified based on the uplink-downlink configuration and to refrain from providing the first voltage to the first power amplifier during a second portion other than the first portion of the at least one downlink subframe.

20. The method of claim 19, wherein the controlling of at least part of the at least one converter to provide the first voltage to the first power amplifier during the first portion of the at least one downlink subframe and to refrain from providing the first voltage to the first power amplifier during the second portion other than the first portion of the at least one downlink subframe comprises:

controlling at least part of the at least one converter to provide the first voltage to the first power amplifier during the first portion of the at least one downlink subframe, located between a first group of the at least one uplink subframe and a second group spaced apart by at least one subframe from the first group.

* * * * *